United States Patent
Gondi et al.

(10) Patent No.: US 10,890,610 B2
(45) Date of Patent: *Jan. 12, 2021

(54) SYSTEM AND METHOD FOR RF AND JITTER TESTING USING A REFERENCE DEVICE

(71) Applicant: Keyssa Systems, Inc., Campbell, CA (US)

(72) Inventors: Srikanth Gondi, Cupertino, CA (US); Arunprasad Ramiya Mothilal, Pleasanton, CA (US)

(73) Assignee: Keyssa Systems, Inc., Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/779,942

(22) Filed: Feb. 3, 2020

(65) Prior Publication Data

US 2020/0174053 A1   Jun. 4, 2020

Related U.S. Application Data

(63) Continuation of application No. 15/848,578, filed on Dec. 20, 2017, now Pat. No. 10,551,420.

(51) Int. Cl.
| | |
|---|---|
| *G01R 31/28* | (2006.01) |
| *G01R 29/10* | (2006.01) |
| *G01R 35/00* | (2006.01) |
| *H04B 17/318* | (2015.01) |
| *H04B 17/15* | (2015.01) |

(Continued)

(52) U.S. Cl.
CPC ............ *G01R 29/10* (2013.01); *G01R 29/26* (2013.01); *G01R 31/2834* (2013.01); *G01R 35/005* (2013.01); *H04B 17/0085* (2013.01); *H04B 17/15* (2015.01); *H04B 17/29* (2015.01); *H04B 17/318* (2015.01); *H04B 17/102* (2015.01)

(58) Field of Classification Search
CPC ........ G01R 27/28; G01R 29/08; G01R 29/10; G01R 29/26; G01R 31/20; G01R 31/28; G01R 31/302; G01R 31/2806; G01R 31/2822; G01R 31/2834; G01R 35/00; H01Q 3/04; H01Q 3/0421; H04B 17/00; H04B 17/15; H04B 17/29; H04B 17/318; H04W 24/00; H04W 24/06
USPC .............. 324/537, 619, 627, 754.03, 754.31; 343/703; 375/219, 224, 295, 316; 455/67.14; 714/719, 738
See application file for complete search history.

(56) References Cited

U.S. PATENT DOCUMENTS

| | | |
|---|---|---|
| 2006/0075318 A1 | 4/2006 | Romero et al. |
| 2011/0237199 A1 | 9/2011 | Venkataraman et al. |

(Continued)

*Primary Examiner* — Shawkat M Ali
(74) *Attorney, Agent, or Firm* — Fish & Richardson P.C.

(57) ABSTRACT

According to some embodiments, a tester tests one or more DUTs by utilizing one or more respective reference devices. The tester comprises one or more test sites and one or more test circuits operatively coupled to each of the test sites. Each test site is configured to: hold a reference device and a DUT, transmit a transmitted electromagnetic RF signal including a test data pattern to the DUT, and receive a received electromagnetic RF signal emitted from the DUT. The test circuits are configured to: receive a first electrical signal converted from the received electromagnetic RF signal, extract first data from the first electrical signal, determine a first error rate between the test data pattern and the first data, and generate a test result on the basis of the first error rate.

21 Claims, 17 Drawing Sheets

(51) Int. Cl.
  *H04B 17/29*   (2015.01)
  *G01R 29/26*   (2006.01)
  *H04B 17/00*   (2015.01)
  *H04B 17/10*   (2015.01)

(56) References Cited

U.S. PATENT DOCUMENTS

| | | |
|---|---|---|
| 2012/0231745 A1 | 9/2012 | Gregg et al. |
| 2013/0093447 A1 | 4/2013 | Nickel et al. |
| 2013/0301694 A1 | 11/2013 | Olgaard |
| 2014/0194069 A1 | 7/2014 | Liu et al. |
| 2014/0253099 A1 | 9/2014 | Han et al. |
| 2017/0170916 A1 | 6/2017 | Olgaard et al. |
| 2018/0340967 A1 | 11/2018 | Rowell et al. |

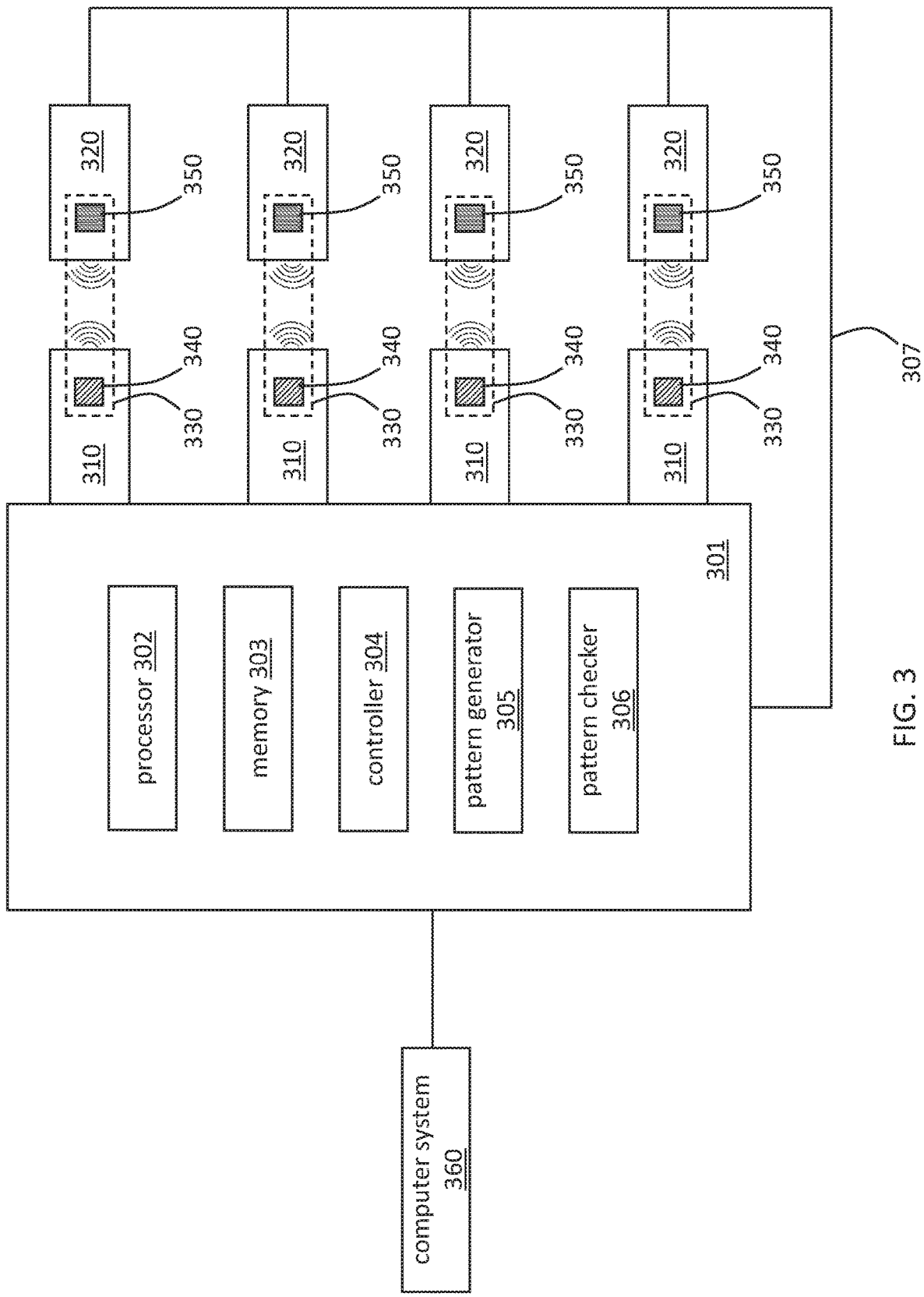

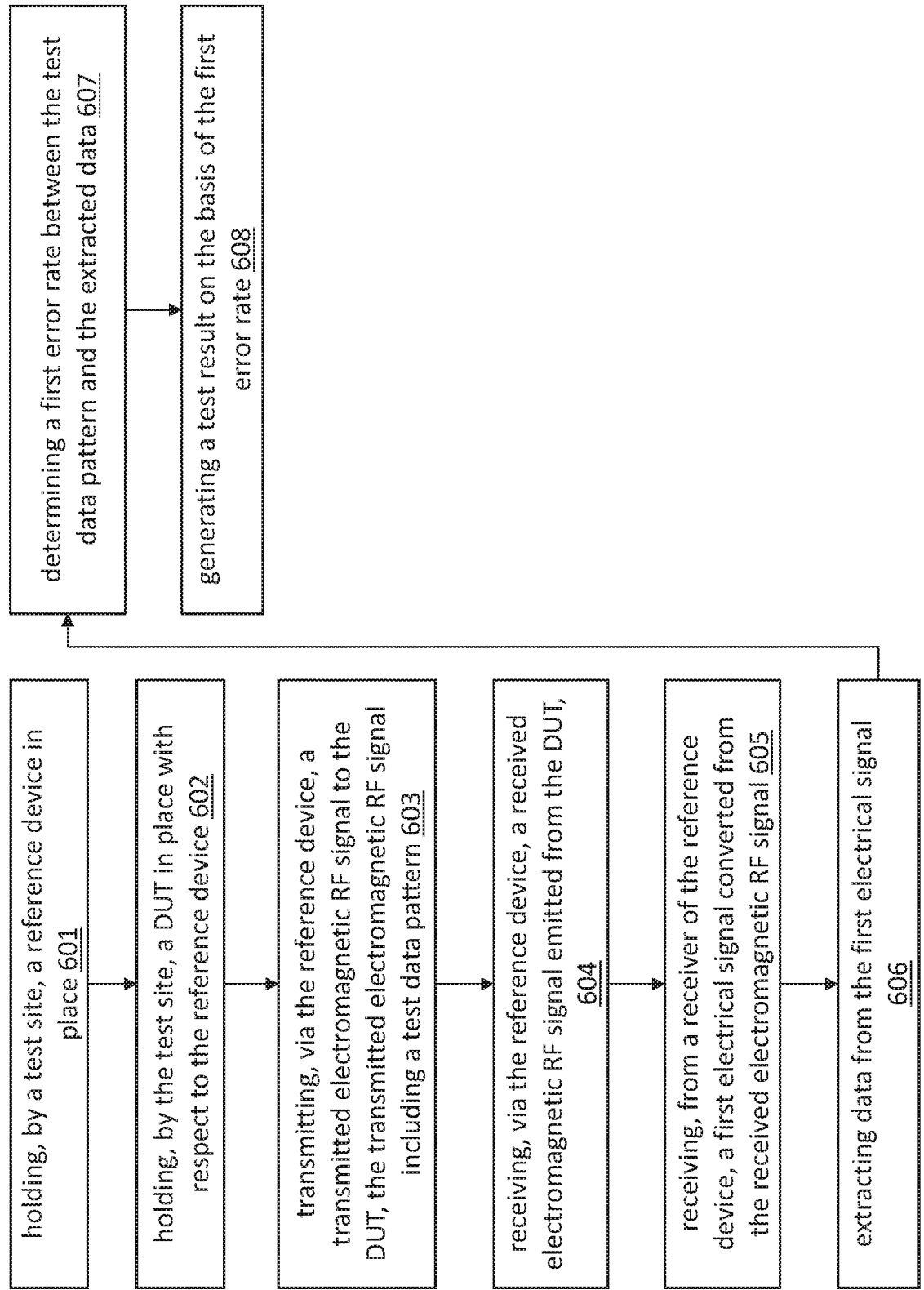

SYSTEM AND METHOD FOR RF AND JITTER TESTING USING A REFERENCE DEVICE

CROSS-REFERENCE TO RELATED APPLICATIONS

This application is a continuation application of, and claims priority to, U.S. patent application Ser. No. 15/848,578, filed on Dec. 20, 2017, and now U.S. Pat. No. 10,551,420. The disclosure of the foregoing application is incorporated here by reference.

BACKGROUND

This specification relates to electromagnetic communications and more particularly to performance testing used for contactless communication.

Advances in semiconductor manufacturing and circuit design technologies have enabled the development and production of integrated circuits (ICs) with increasingly higher operational frequencies. In turn, electronic products and systems incorporating high frequency integrated circuits provide greater functionality than previous generations of products. The additional functionality has typically included the processing of increasingly larger amounts of data at increasingly higher speeds.

Conventional testing typically employs automatic test equipment ("ATE") to perform one or more tests on a device or component, referred to as a device under test ("DUT"). ATE is typically used to test electronic components and systems after being fabricated. Conventional ATE can automatically perform tests and evaluate results, which can reduce the time needed to test components at various stages of production (e.g., die level, package level, module level, and prior to assembly in a final product or prior to sale). However, conventional ATE capable of testing both signal integrity (e.g., RF performance) requiring a continuous wave signal and jitter requiring a modulated signal at the same time, e.g., in a single insertion, seems to be non-existent, or if it does exist, it may not be widely available or cost effective. This drawback of conventional ATE can be exacerbated when testing extremely high frequency communications, e.g., 60 GHz, components because it would typically require up/down converters and modulated signal sources at the same time.

SUMMARY

A tester for testing one or more devices under test (DUTs) is presently disclosed. The tester according to some embodiments is as follows. The tester tests one or more DUTs designed to meet a predetermined set of operational specifications by utilizing one or more respective reference devices. The tester comprises one or more test sites and one or more test circuits operatively coupled to each of the test sites. Each of the test sites is configured to: hold a reference device, hold a DUT with respect to the reference device, transmit, via the reference device, a transmitted electromagnetic RF signal to the DUT, the transmitted electromagnetic RF signal including a test data pattern, and receive, via the reference device, a received electromagnetic RF signal emitted from the DUT. One or more of the test circuits are configured to, for each of the test sites: receive, from a receiver of the reference device, a first electrical signal converted from the received electromagnetic RF signal, extract first data from the first electrical signal, determine a first error rate between the test data pattern and the first data, and generate a test result on the basis of the first error rate.

A method of testing one or more DUTs is presently disclosed. The method according to some embodiments is as follows. The method tests one or more DUTs designed to meet a predetermined set of operational specifications by utilizing one or more respective reference devices. The method is performed by testing equipment including one or more test sites and one or more test circuits operatively coupled to each of the test sites. The method comprises, for each of the test sites: holding a reference device; holding a DUT with respect to the reference device; transmitting, via the reference device, a transmitted electromagnetic RF signal to the DUT, the transmitted electromagnetic RF signal including a test data pattern; receiving, via the reference device, a received electromagnetic RF signal emitted from the DUT; receiving, from a receiver of the reference device, an electrical signal converted from the received electromagnetic RF signal; extracting data from the electrical signal; determining an error rate between the test data pattern and the extracted data; and generating a test result on the basis of the error rate.

The subject matter described in this specification can be implemented in particular embodiments so as to realize one or more of the following advantages. RF performance and jitter can be tested for a communication module including communication modules operating at extremely high frequencies, e.g., 60 GHz, in a single insertion. The use of a reference device to perform both RF performance and jitter tests eliminates the need for one or more ATE's using up/down converters, which reduces calibration, maintenance, and costs for high volume testing. Additionally, as compared to traditional testing techniques that use multiple insertions, the herein described techniques increase speed of testing by using a single insertion.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 3 is a block diagram of an example implementation of a testing system for testing one or more DUTs by using one or more respective reference devices, according to an embodiment of the present disclosure.

FIG. 6 illustrates an example method of performing data error testing on the one or more DUTs, according to an embodiment.

DETAILED DESCRIPTION

Overview

Conventional ATE hardware may be built to separately test either RF performance or jitter individually. This specification describes hardware and techniques for testing multiple parameters of a contactless communication module using a single insertion. In particular, techniques are described for performing tests on RF performance and jitter for the communication modules using a reference device. RF performance testing, for example, may entail determining whether the transmitter power or receiver sensitivity of the communication module meets predetermined design criteria. Jitter testing can include measuring the degree of errors, i.e., an error rate, introduced in information encoded as a modulated signal.

In particular, this specification describes techniques for testing both RF and jitter of a communication module in a single insertion by using a reference device that has already passed testing and therefore is known to operate according to designed operational parameters. These techniques may be applied to test one or more communication modules in parallel by using corresponding reference devices, thereby reducing test costs and improving final manufacturing yield.

Contactless Communication Modules

Contactless communication may be used to provide signal communications between components on a device or may provide communication between devices. In one example, tightly-coupled transmitter/receiver pairs may be deployed with a transmitter disposed at a terminal portion of a first conduction path and a receiver disposed at a terminal portion of a second conduction path discontiguous with the first conduction path. The transmitter and receiver may be disposed in close proximity, for example, in the case of low-power transmitter/receiver pairs, to enable contactless communication with each other. In some examples, the transmitter and receiver may be disposed on separate circuit carriers positioned with transducers (e.g., one or more antennas) of the transmitter/receiver pair in close proximity.

A transmitter, receiver, or transceiver may be configured as an integrated circuit (IC) package, in which one or more transducers may be positioned adjacent to a die and held in place by a dielectric or insulating encapsulation or bond material. A transducer may also be held in place by a lead frame substrate. Note that IC packages are examples of contactless communication units that are also variously referred to as communication units, communication devices, comm-link chips, comm-link chip assemblies, comm-link chip packages, and/or comm-link packages, which may be configured in various ways. For example, IC packages, communication units, communication devices, comm-link chips, comm-link chip assemblies, comm-link chip packages, and/or comm-link packages may each include one or more ICs, chips, or dies and have circuit functionality appropriate for particular applications.

Figure 1:
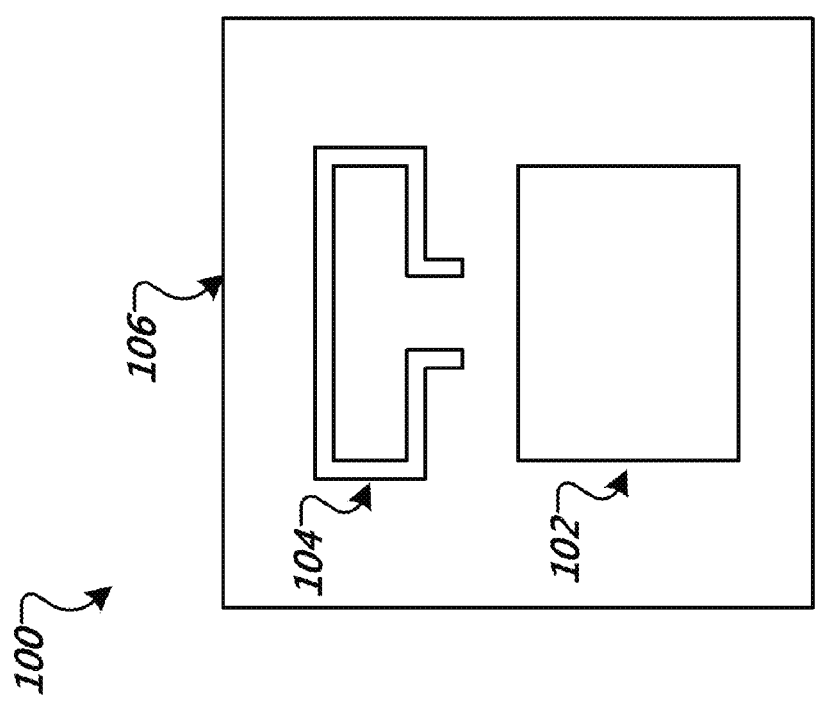
FIG. 1 shows an example IC package.

FIG. 1 shows an example IC package 100. The IC package 100 includes a die 102 and a transducer 104 providing conversion between electrical and EM signals. The IC package 100 may include additional structures, for example, conductive connectors, such as bond wires, electrically connecting the transducer to bond pads connected to a transmitter and/or receiver circuit included in die 102. The IC package 100 further includes an encapsulating material 106 formed around at least a portion of the die 102 and/or the transducer 104. In the example IC package 100, the encapsulating material 106 completely covers the die 100 and the transducer 104.

The die 102 includes any suitable structure configured as a circuit on a suitable die substrate. In some implementations, the die can alternatively be referred to as a chip or an integrated circuit. The die substrate may be composed of any suitable semiconductor material, for example, silicon. The die 102 may be mounted with electrical conductors, such as a lead frame, not shown in FIG. 1, electrically coupling the die 102 to one or more external circuits. The IC package 100 can further include a transformer to provide impedance matching between a circuit on the die 102 and the transducer 104.

The transducer 104 may be in the form of a folded dipole or loop antenna and is configured to transmit and/or receive electromagnetic signals. In some implementations, the transducer 104 is configured to operate at radio frequencies including radio frequencies in the extremely high frequency (EHF) band of the electromagnetic spectrum, e.g., frequencies from 30 to 300 GHz. As shown in IC package 100, the transducer 104 is separate from the die 102, but is coupled to the die 102 by suitable conductors, not shown. The dimensions of the transducer are determined such that they are suitable for operation in the specified frequency band of the electromagnetic spectrum, e.g., the EHF band.

Figure 2:
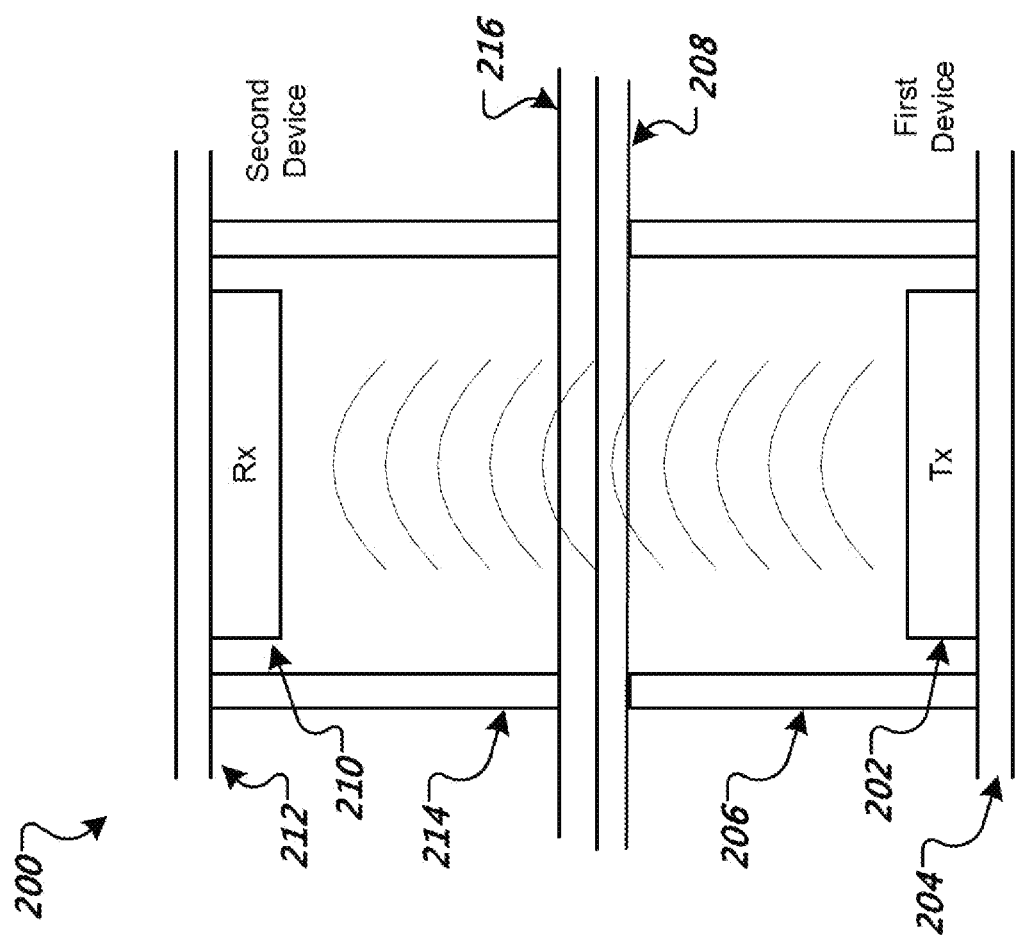
FIG. 2 is side view diagram of an example of contactless communication between a pair of devices.

FIG. 2 is a side view diagram 200 illustrating an example of contactless communication between a transceiver packages, e.g., that can switch between transmitter and receiver. FIG. 2 illustrates communication between a transmitter (Tx) and a receiver (Rx). For example, a first device may exchange data with a second device. Communication can flow in the opposite direction from the second device to the first device by switching the transmitter of the first device to a receiver and the receiver of the second device to a transmitter. The two devices can be positioned in proximity to each other such that the respective communication modules for transmitting and receiving data are aligned and in range of each other. In particular, for EHF frequencies, the transmitter and receiver of the two devices may need to be within specified distances. The distances can vary, for example, depending on the particular frequencies used, the materials between the transmitter and receiver, and the strength of the transmission.

In FIG. 2, a first device includes a first communication module having a transceiver IC package 202 operating as a transmitter and positioned on a first PCB 204. The transceiver IC package 202 is surrounded by a first signal guiding structure 206 forming a channel. The first signal guiding structure 206 extends to a surface of a first housing 208 of the first device. For example, the first device can be a first mobile phone and the first housing 208 can correspond to the outer case of the first mobile phone. The signal guiding structure is configured to aid in directing radio frequency (RF) signals as well as to reduce interference from spurious signals. The signal guiding structure can surround a perimeter of the IC package and extend in the direction of signal transmission and/or reception by a specified amount to provide a channel for emitted or received RF signals. For example, the signal guiding structure can have a height suitable for a particular device including the communication module and that allows the signal guiding structure to be positioned in proximity to a corresponding signal guiding structure of another communication module when used to communicate with another device. The communication module can be configured to transmit or receive data using radio frequency communication. For example, if the communication module includes a transmitter, the communication module can transmit data, which can then be received by a receiver, e.g., of another communication module.

The communication module can be part of a communication system of a device, e.g., a computer, mobile phone, tablet, kiosk, or other device/system. The communication system can be configured to provide contactless communication using one or more IC packages. For example, the communication system can include two IC packages, one configured as a transmitter and the other configured as a receiver. The communication system can be in communication with a storage device. Thus, for example, the communication system can transfer data between the data storage unit and an external device using contactless communication provided by the IC packages.

A second device includes a second communication module having a transceiver IC package 210 operating as a receiver and positioned on a second PCB 212. The transceiver IC package 210 is surrounded by a second signal guiding structure 214 forming a channel. The second signal guiding structure 214 extends to a surface of a second housing 216 of the second device. For example, the second device can be a second mobile phone and the second housing 216 can correspond to the outer case of the second mobile phone. The signal guiding structures can be formed of metallic or metallic lined walls that surround the IC package 210.

As illustrated by diagram 200, the first signal guiding structure 206 and the second signal guiding structure 214 are aligned and an outer surface of the first housing 208 and the second housing 216 are in physical contact to provide optimal communication distance and interference.

A data transmission from the transceiver IC package 202 passes through the channel formed by the first signal guiding structure 206 and the second signal guiding structure 214 to the transceiver IC package 210. For example, a pair of devices can communicate data between each other by transmitting data from the transceiver IC package 202 to the transceiver IC package 210. The signal guiding structures along with proper alignment can maximize the power of the transmission that is received by the receiver IC package.

Testing

Although contactless communication modules have been described above, the presently disclosed testing equipment and techniques are not limited to testing contactless communication modules; rather, they are applicable for testing a wide range of communication components and devices. As such, a device or component described as being tested hereinafter will be referred to in general terms as a device under test (DUT). For example, a DUT may be a component-level device, such as a wireless chip or module, or a system-level device, such as a mobile phone, a television, or some other electronic product.

FIG. 3 is a block diagram of an example implementation of a testing system for testing one or more DUTs by using one or more respective reference devices, according to an embodiment of the present disclosure. The testing system, or tester, includes four test sites 330 (though the number of test sites may vary according to other embodiments). Thus, the tester of FIG. 1 may be utilized to test up to four DUTs in parallel.

Each test site 330 is configured to hold a reference device 340 in place, as well as hold a DUT 350 in place with respect to the reference device 340. In some cases, each of the test sites 330 may be configured to hold the reference device 340 in place using substantially the same mechanism as that to hold the DUT 350. For example, each test site 330 may include a first test socket for holding the reference device 340 and a second test socket for holding the DUT 350. If the reference device 340 and DUT 350 have the same form factor, the first and second test sockets may be substantially identical in structure. Depending on the form factor of the DUT 350, the test site 330 may include an adapter or other structure for holding the DUT 350 in place with respect to the reference device 340. Each test site 330 may be configured to interface with the reference device 340 in a same way (e.g., same protocol and electrical interface) as with the DUT 350.

The reference device, like the DUT, may be a component-level device or a system-level device. For example, if the DUT is a mobile phone, the reference device may be a docking device for the mobile phone. The reference device may include a structure or mechanical feature configured to mate or otherwise couple with a structure of the DUT. The reference device may also include alignment adjustment mechanisms that would enable a test operator to create a misalignment with the DUT and thereby perform testing at the boundaries to simulate worst-case scenarios, as opposed to testing at an optimal mechanical alignment. These alignment adjustment mechanisms are further described below in connection with FIGS. 11A-11C.

The test site 330 may hold the reference device 340 and DUT 350 a predetermined distance from each other. The distance may be predetermined to comply with a set of operational specifications in which the DUT 350 is designed to meet. For example, for the case in which the DUT 350 is designed to communicate with another DUT within a range of 20 millimeters, such as the case with low-power EHF signals, the reference device 340 and DUT 350 may be held within a predetermined distance of 10 millimeters from each other. Instead of a fixed predetermined distance in some embodiments, in other embodiments, the test site 330 may include mechanisms for adjusting the distance between the reference device 340 and 350. The test site 330, reference device 340, and/or the DUT 350 may also include a dielectric waveguide or other conduit structures to focus and facilitate propagation of electromagnetic RF signals between the reference device 340 and DUT 350. The waveguide may comprise of one or more types of materials that may be different from one another. For example, the waveguide may be part of a housing of the DUT 350, and the waveguide material may change according to the type of device (e.g., cellphone housing, laptop housing, and television housing).

The tester may include one or more test circuits. One or more of the test circuits may be implemented using field-programmable gate arrays (FPGAs), application-specific integrated circuits (ASICs), and the like. In the case of FIG. 1, the tester includes a main circuit board 301 and daughter circuit boards 310 and 320 operatively coupled to the main circuit board 301. The main circuit board 301 includes test circuits such as processor 302, memory 303, controller 304, pattern generator 305, and pattern checker 306. Although FIG. 1 shows these test circuits as being part of the main circuit board 301, the allocation of these test circuits may vary according to embodiment. For example, in some embodiments, the controller 304, pattern generator 305 and pattern checker 306 may be included in each of the daughter circuit boards instead of the main circuit board 201. The daughter boards 310 and 320 may be modular and detachable from the main circuit board 301 for ease of repair and replacement and for accommodating various mechanical or protocol requirements. Furthermore, one or more of the circuits in FIG. 1 may be omitted or additional test circuits may be incorporated, according to various embodiments.

According to an embodiment, the processor 302 may process data from the test sites and instructions from an external computer system 360. The processor 302 may also issue instructions to and process data from other test circuits, such as the memory 303, controller 304, pattern generator 305 and pattern checker 306. The memory 303 may include various memory types, such as random access memory (RAM), read-only memory (ROM), cache memory, hardware registers, a solid-state drive, a hard-drive, etc., for storing test data, test instructions, test flows, test algorithms, firmware, device logs, etc. The controller 304 may control the operations of each of the test sites 330 through communication with the corresponding daughter boards 310 and 320. The pattern generator 305 may generate one or more data/test patterns for incorporation into a test signal. The data/test patterns may include a deterministic pattern, such as a pseudorandom binary sequence (PRBS), industry standard specific patterns, such as compliance patterns (e.g., CP0 and CP1) and training patterns (e.g., TSEQ, TS1, and TS2) according to the USB 3.0 or USB-SS standard, or any other pattern having any bit sequence (e.g., D10.2 pattern for DisplayPort standard and ALIGN pattern for SATA standard). One or more of the data/test patterns may be repeated or looped a specified number of times to form the sequence of data/test patterns in the test signal. The pattern checker 306 may verify data extracted from a test signal against a known or expected data pattern, which would enable the tester to determine an error rate between the extracted data and the data pattern. The computer system 360 may communicate data and instructions with the main circuit board 301, as well as receive user input, for example, from a tester operator and display test results to the tester operator. The computer system 360 may also process and log test results pertaining to the DUTs being tested.

One or more of the test circuits of the tester are operatively coupled to each of the test sites. For example, in the case of FIG. 3 and FIG. 4A, when both the reference device 340 and DUT 350 are held in place by the test site, the reference device 340 is electrically connected to the test site 330 and daughter board 310, and the DUT 350 is electrically connected to the test site 330 and daughter board 320. The daughter boards 310 and 320, in turn, are electrically connected to the main circuit board 301. The daughter board 320 may be connected to the main circuit board 301 via a connection 307. The daughter board 320 may provide electrical power to the DUT 350 and communicate data and instructions electrically with the DUT 350, for example, via a serial peripheral interface (SPI).

According to other embodiments, however, the DUT 350 may not be electrically connected to the test site, the one or more circuits, or any other part of the tester. For example, the DUT 350 may be a module, a finished product (e.g., laptop and smart phone) or other closed system that does not provide external access to circuitry of the DUT 350. In such embodiments, the DUT 350 would not be electrically connected to the daughter board 320 and therefore would not be electrically connected to the tester via the connection 307. The daughter board 320 may even be omitted in these cases. The test site 330 may include a structure or mechanism that holds the DUT 350 in place with respect to the reference device 340. Certain embodiments in which external access to the DUT 350 is unavailable are further discussed below with respect to FIGS. 4B-4D.

Figure 4A:
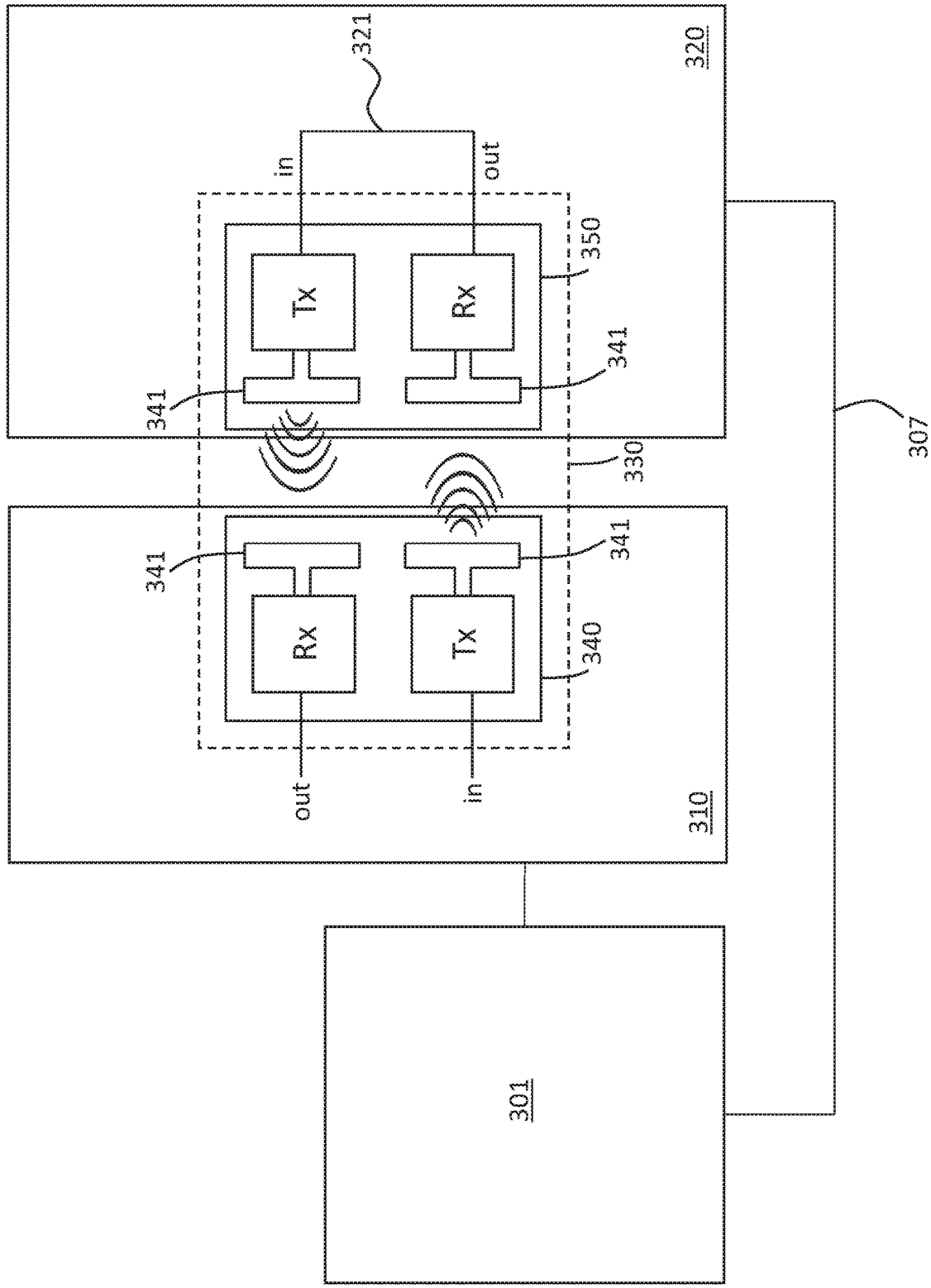
FIGS. 4A, 4B, 4C and 4D each illustrates a block diagram that shows one test site of a tester that uses a reference device to test a DUT, according to an embodiment.

FIG. 4A illustrates a block diagram that shows one test site of a tester that uses a reference device to test a DUT, according to an embodiment. The DUT 350 and reference device 340 each may include one or more communication modules, which may be similar to the communication module described above. The communication module may include a transceiver that can be tested in both transmitter and receiver modes. The DUT 350 may include one or more separate transmitters and receivers that can be individually tested. For example, the device under test can be include multiple transceivers for performing multi-lane communication with another device. In the embodiment of FIG. 4A, each of the reference device 340 and 350 includes a transmitter (Tx) and a receiver (Rx) coupled to a transducer 341 (e.g., antenna). In another embodiment, each of the transmitter and receiver may be a transceiver. In another embodiment, one transceiver may serve as both the transmitter and receiver.

The communication modules used in each of the reference device 340 and DUT 350 may be substantially identical in structure except for variations due to manufacturing tolerance and defects. These communication modules may be manufactured according to the same design to meet the same predetermined set of operational specifications. The communication modules in the reference device 340 may differ from those in the DUT 350 in that the communication modules in the reference device 340 have already been verified to perform within the predetermined set of operational parameters.

As shown in FIG. 4A, the test site 330 may transmit, via the transmitter of the reference device 340, a transmitted electromagnetic RF signal and receive, via the receiver of the DUT 350, a corresponding received electromagnetic RF signal. For example, the test site 330 may input a first electrical signal to the reference device 340, the transmitter of the reference device 340 may modulate the first electrical signal, and the corresponding transducer 341 may convert the modulated electrical signal into the transmitted electromagnetic RF signal. The corresponding transducer 341 of the DUT 350 may receive the transmitted electromagnetic RF signal as the received electromagnetic RF signal and convert it into an electrical signal. The receiver of the DUT 350 may demodulate the electrical signal and output the demodulated electrical signal as a second electrical signal to the test site 330.

Similarly, the test site 330 may transmit, via the transmitter of the DUT 350, a transmitted electromagnetic RF signal and receive, via the receiver of the reference device 340, a corresponding received electromagnetic RF signal. For example, the test site 330 may input a third electrical signal to the DUT 350, the transmitter of the DUT 350 may modulate the third electrical signal, and the corresponding transducer 341 may convert the modulated electrical signal into the transmitted electromagnetic RF signal. The third electrical signal for inputting into the DUT 350, for example, may be the second electrical signal routed via a connection 321 from the receiver of the DUT 350. In some cases, the tester may correct data errors in the second electrical signal before routing it to the transmitter Tx of the DUT 350 as the third electrical signal. The corresponding transducer 341 of the reference device 340 receives the transmitted electromagnetic RF signal as the received electromagnetic RF signal and converts it into an electrical signal. The receiver of the reference device 340 demodulates the electrical signal and outputs the demodulated electrical signal as a fourth electrical signal to the test site 330.

Figure 4B:
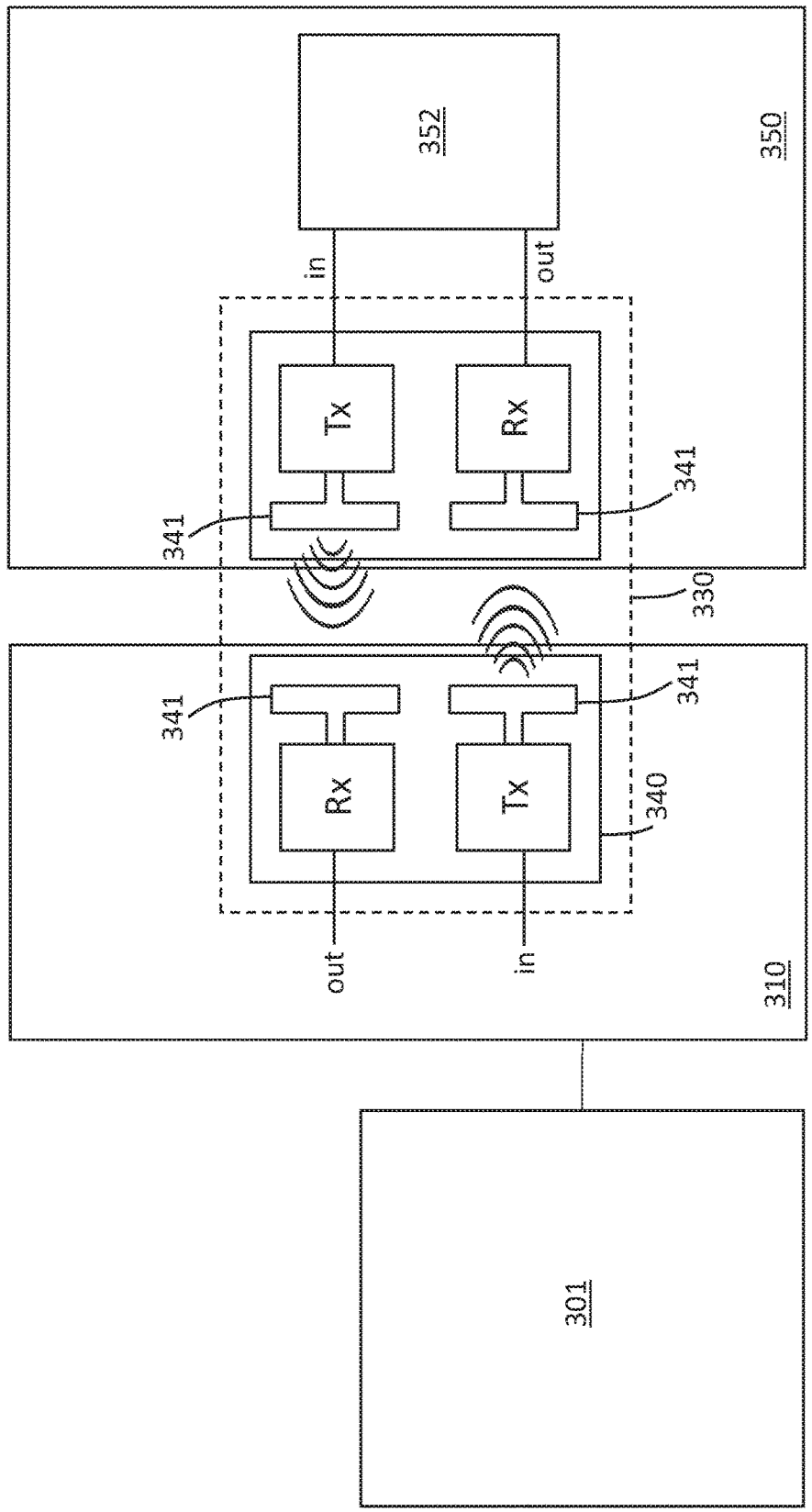

FIG. 4B illustrates a block diagram that shows one test site of a tester that uses a reference device to test a DUT, according to another embodiment. The embodiment of FIG. 4B is substantially similar to that of FIG. 4A except that the test site 330 is not electrically connected to the DUT 350 (e.g., due to the DUT's housing), such as would be the case if the DUT 350 is a television, laptop, cellphone, and the like. Rather, the DUT 350 of FIG. 4B includes a control circuit, which, in this case, is a PHY circuit 352 that can be implemented, for example, as an integrated circuit (IC) with PHY—Physical Layer—functionality.

As shown in FIG. 4B, the test site 330 may transmit, via the transmitter of the reference device 340, a transmitted electromagnetic RF signal and receive, via the receiver of the DUT 350, a corresponding received electromagnetic RF signal. For example, the test site 330 may input a first electrical signal to the reference device 340, the transmitter of the reference device 340 may modulate the first electrical signal, and the corresponding transducer 341 may convert the modulated electrical signal into the transmitted electromagnetic RF signal. The corresponding transducer 341 of the DUT 350 may receive the transmitted electromagnetic RF signal as the received electromagnetic RF signal and convert it into an electrical signal. The receiver of the DUT 350 may demodulate the electrical signal and output the demodulated electrical signal as a second electrical signal to the PHY circuit 352.

The PHY circuit 352 may route or loopback the second electrical signal as-is to the transmitter Tx of the DUT 350 as a third electrical signal. In some cases, the PHY circuit 352 may correct data errors in the second electrical signal before routing it to the transmitter Tx of the DUT 350 as the third electrical signal. Whether PHY circuit 352 routes the second electrical signal as-is or corrects data error before routing may depend on a mode of operation of the PHY circuit 352, which may be specified by one or more commands included in the second electrical signal. This loopback method of testing may be applied to test DUTs that support the USB-SS (SuperSpeed USB), SATA and PCIe standards.

The transmitter of the DUT 350 may modulate the third electrical signal, and the corresponding transducer 341 may convert the modulated electrical signal for transmission as the received electromagnetic RF signal. The corresponding transducer 341 of the reference device 340 receives the received electromagnetic RF signal and converts it into an electrical signal. The receiver of the reference device 340 demodulates the electrical signal and outputs the demodulated electrical signal as a fourth electrical signal to the test site 330.

Figure 4C:
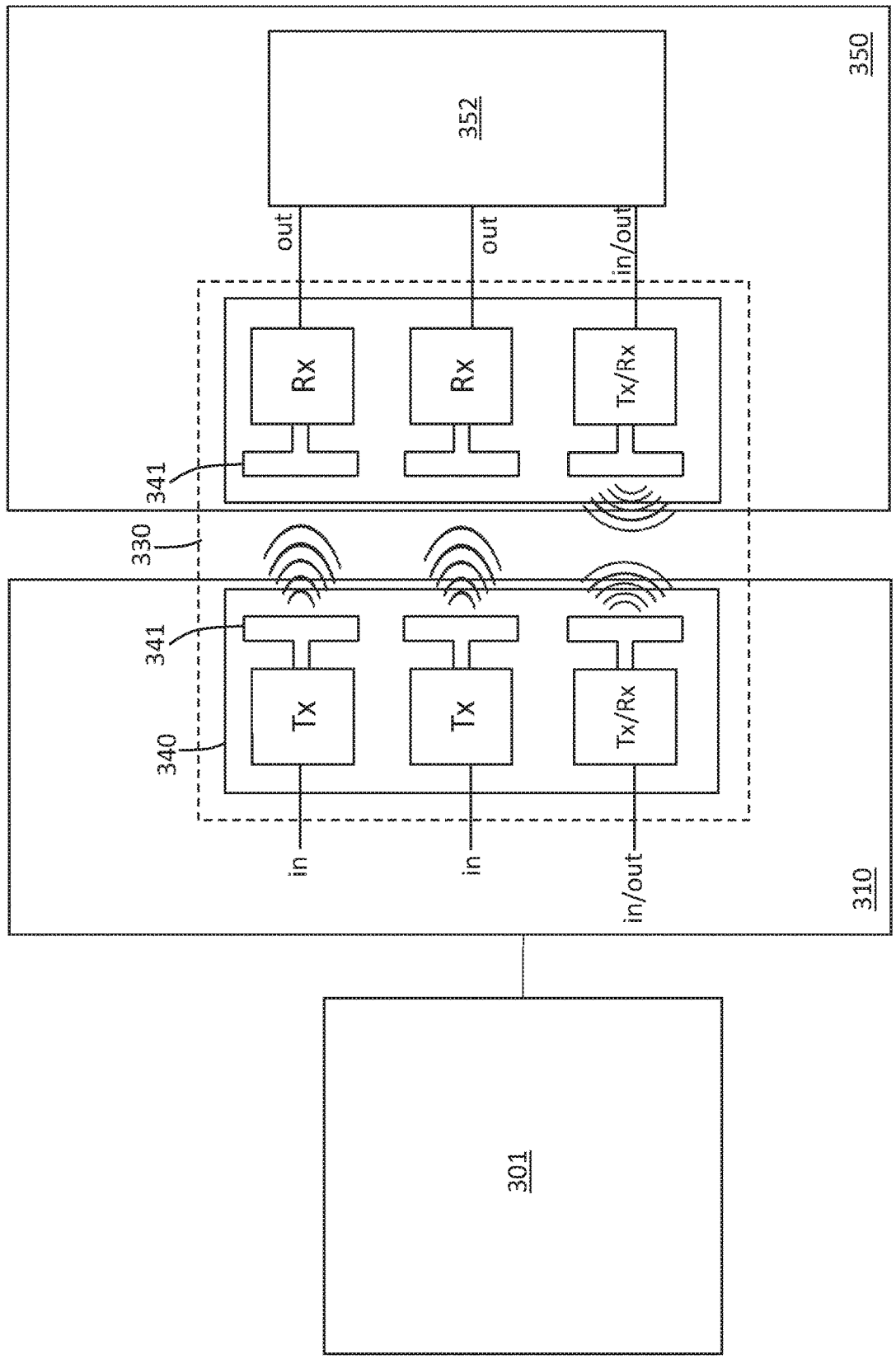

FIG. 4C illustrates a block diagram that shows one test site of a tester that uses a reference device to test a DUT, according to another embodiment. The embodiment of FIG. 4C is similar to that of FIG. 4B except that the structure of reference device 340 does not mirror the structure of the DUT 350. In the case of FIG. 4C, the DUT 350 includes two or more receivers Rx and a transceiver Tx/Rx, each coupled to the PHY circuit 352, and the reference device 340 includes two or more transmitters Tx and a transceiver Tx/Rx, though any number of transmitters Tx, receivers Rx and transceivers Tx/Rx may be implemented. The reference device 340, for example, may be a base or docking system and may send electromagnetic RF signals (e.g., display data) via its two transmitters Tx to the corresponding two receivers of the DUT 350, which may be a display device. The reference device 340 and DUT 350 may also send and receive electromagnetic signals (e.g., commands) with each other via their respective transceiver Tx/Rx.

Figure 4D:
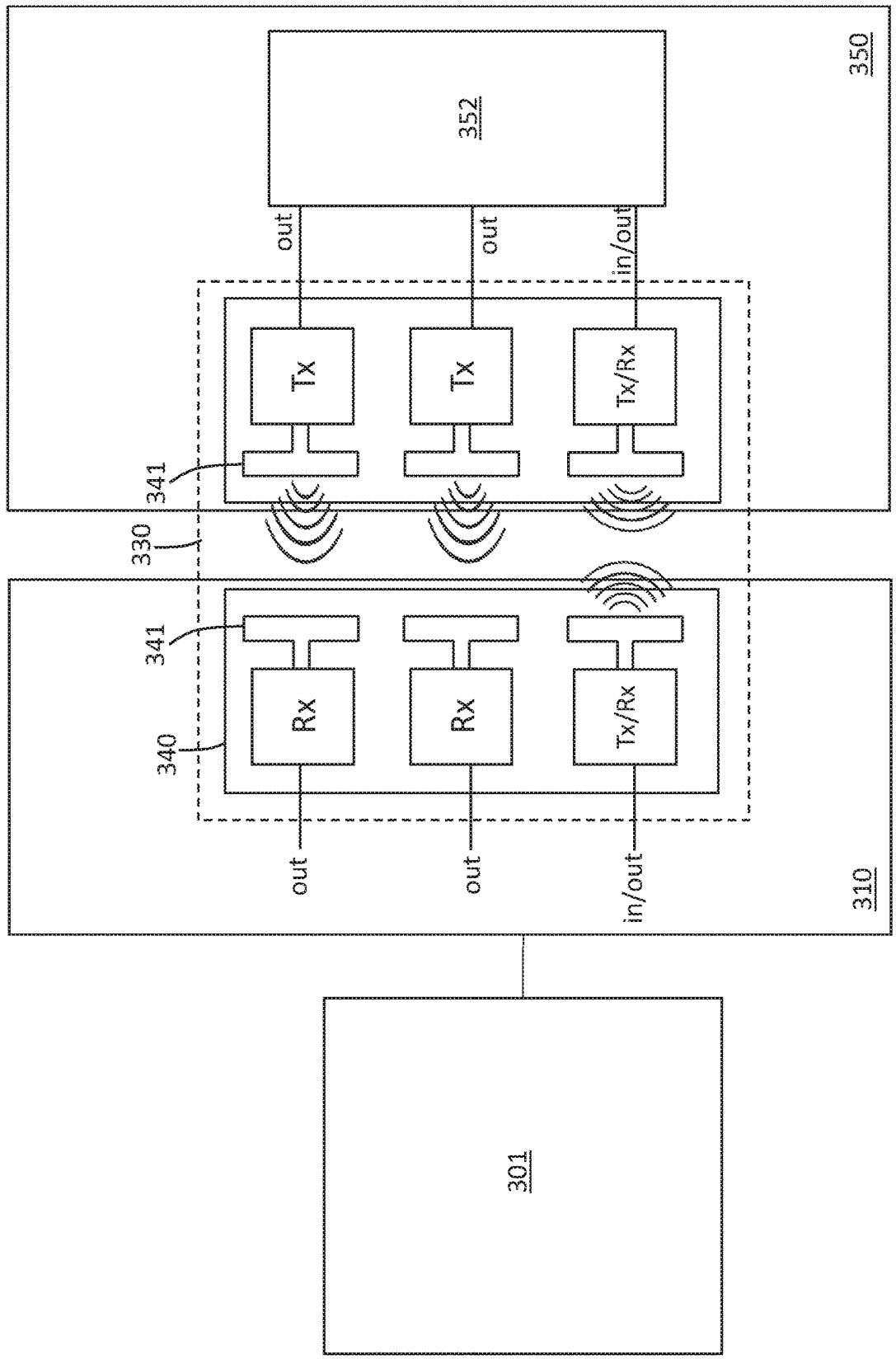

FIG. 4D illustrates a block diagram that shows one test site of a tester that uses a reference device to test a DUT, according to another embodiment. The embodiment of FIG. 4D is similar to that of FIG. 4C except that the structure of reference device 340 and the structure of the DUT 350 are reversed. In the case of FIG. 4D, the reference device 340 includes two or more receivers Rx and a transceiver Tx/Rx, and the DUT 350 includes two or more transmitters Tx, each coupled to the PHY circuit 352, and a transceiver Tx/Rx, though any number of transmitters Tx, receivers Rx and transceivers Tx/Rx may be implemented. The DUT 350, for example, may be a base or docking system and may send electromagnetic RF signals (e.g., display data) via its two transmitters Tx to the corresponding two receivers of the reference device 340, which may be a display device. The reference device 340 and DUT 350 may also send and receive electromagnetic signals (e.g., commands) with each other via their respective transceiver Tx/Rx.

Figure 5:
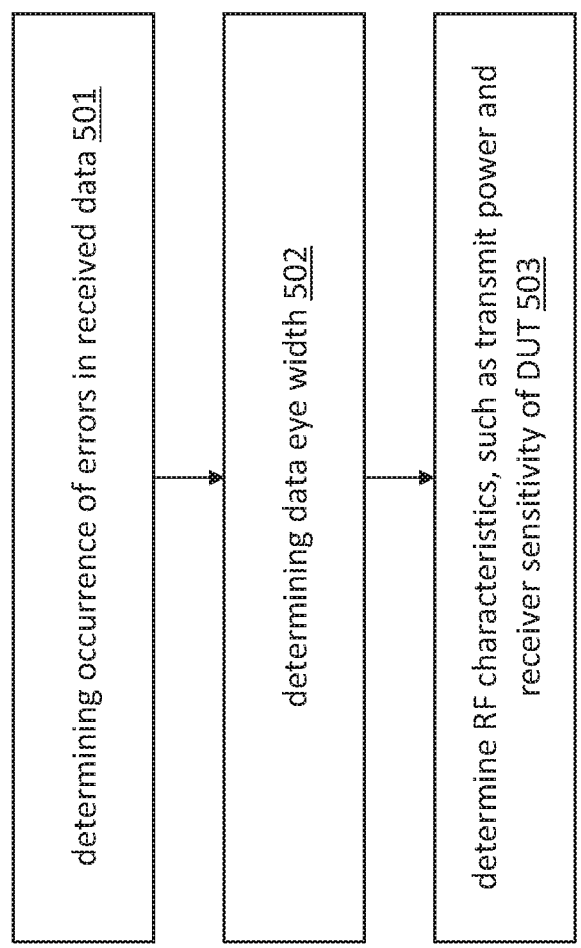
FIG. 5 illustrates an example order of testing a DUT by the presently disclosed tester, according to an embodiment.

FIG. 5 illustrates an example order of testing a DUT by the presently disclosed tester, according to an embodiment. The tester determines occurrence of errors in received data (at 501). For example, as discussed below in connection with FIG. 6, the tester may transmit a signal including a test data pattern to the DUT and compare data extracted from a signal received from the DUT against the test data pattern to determine an error or mismatch rate between the extracted data and the test data pattern. If the error rate exceeds a predetermined tolerance level, the tester may indicate that the DUT failed testing and stop the test flow.

If the error rate is within the tolerance level, the tester may determine a data eye width (e.g., width w of FIGS. 9 and 10) associated with the DUT (at 502). However, determining the data eye width may be time consuming and thus may be omitted in some cases. A narrow data eye width may indicate existence of electrical issues or defects. A discussion of how the data eye width may be determined is provided below in connection with FIGS. 9 and 10.

If the data eye width is determined to be within a predetermined tolerance level, the tester may determine RF characteristics of the DUT, such as the transmit power and receiver sensitivity of the DUT (at 503). For example, the tester may characterize the receiver sensitivity of the DUT using the methods shown in FIGS. 7A and 7B and characterize the transmit power of the DUT using the method shown in FIG. 8. In some cases, tester may simply screen out (e.g., pass/fail) DUTs with a weak transmitter, weak receiver, or both, using the method shown in FIG. 7C.

FIG. 6 illustrates an example method of performing data error testing on the one or more DUTs, according to an embodiment. The method of FIG. 6 may be practiced, for example, by the tester shown in FIGS. 3, 4A and 4B, which includes one or more test sites. According to the example method, a test site holds a reference device in place (at 601) and holds a DUT in place with respect to the reference device (at 602). The test site transmits, via the reference device, a transmitted electromagnetic RF signal to the DUT (at 603). The transmitted electromagnetic RF signal includes a test data pattern. The test site receives, via the reference device, a received electromagnetic RF signal emitted from the DUT (at 604).

One or more test circuits of the tester receives, from a receiver of the reference device, a first electrical signal converted from the transmitted electromagnetic RF signal (at 605). One or more of the test circuits extracts first data from the first electrical signal, for example, by sampling (at 606). One or more of the test circuits determines a first error rate between the test data pattern and the first data (at 607). The error rate may be based on the amount of mismatch between the test data pattern and the extracted data. Mismatch may be determined by a pattern checker, for example, that compares the extracted data against the test data pattern; or if the test data pattern is generated deterministically, such as in the case of a PRBS (or CP0, CP1, or any deterministic pattern), the pattern checker may check the extracted data for errors deterministically.

When testing the DUT for communication under the USB-SS, SATA, and PCIe standards, the first error rate accounts for errors occurring in the transmitted electromagnetic RF signal and the received electromagnetic RF signal because the transmitted electromagnetic RF signal is converted to an electrical signal by the DUT and the electrical signal is looped back to the DUT for transmission as the received electromagnetic RF signal. As described earlier, the loopback may be performed by the tester (e.g., via connection 321 of FIG. 4A) or by a control circuit (e.g., PHY circuit 352) connected to the DUT.

In some cases, the tester may determine the error rate associated with just the received electromagnetic RF signal. For example, the tester may correct data errors in the electrical signal, either by using one or more of its test circuits or by instructing the control circuit to do so, before looping back the electrical signal back to the DUT.

In some cases in which the tester has electrical access to the DUT, such as shown in FIGS. 3 and 4A, the tester may determine the error rate associated with just the transmitted electromagnetic RF signal. For example, the tester may receive, from a receiver of the DUT, a second electrical signal converted from the transmitted electromagnetic RF signal, extract second data from the second electrical signal, and determine a second error rate between the test data pattern and the second data.

Referring back to FIG. 6, the tester may generate a test result on the basis of the first error rate (at 608). For example, the tester may generate a pass status if the first error rate is within a predetermined tolerance level and a fail status if the first error rate exceeds a predetermined tolerance level. As described above in connection with FIG. 5, if the DUT passes error testing, the tester may further determine a data eye width associated with the DUT as part of the test result. A narrow data eye width may be caused by and thus serve as an indication of an electrical defect or issue in the DUT.

Figure 9:
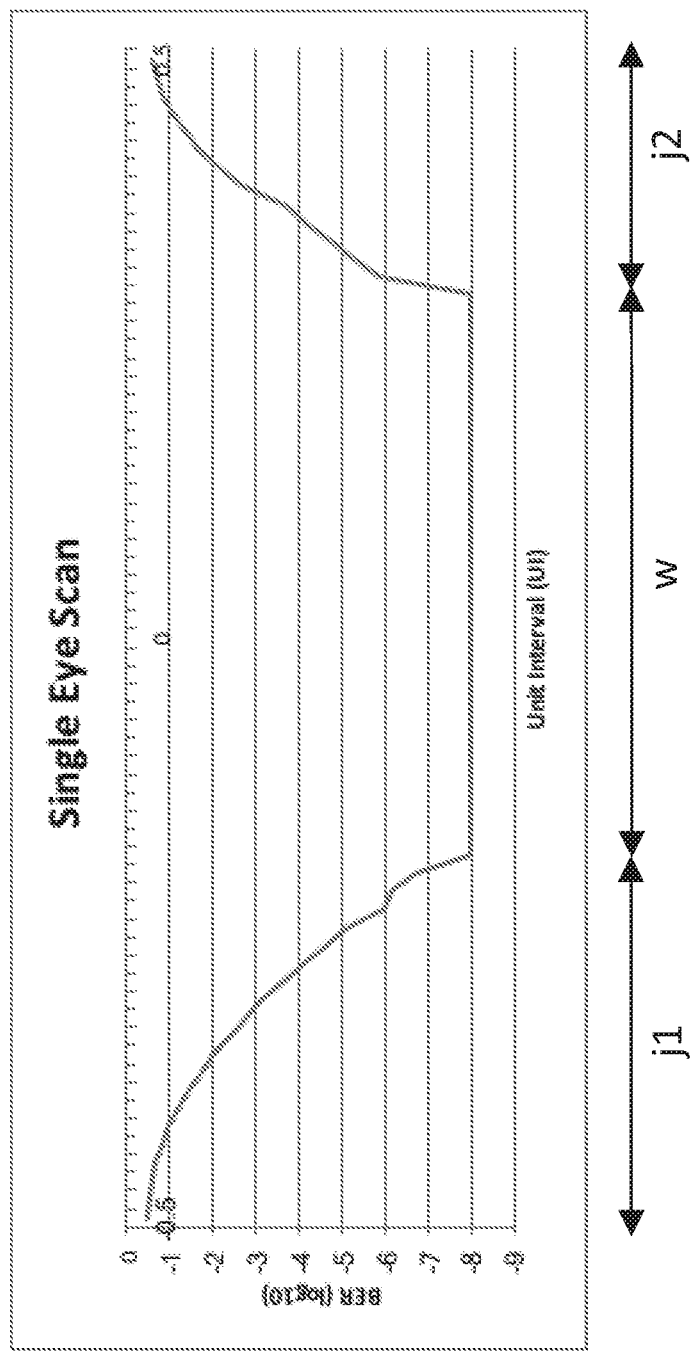
FIG. 9 shows an example bathtub curve representing error rates over a range of phase offsets of a sampling clock.

To determine the data eye width, the tester may determine error rates over a range of phase offsets of the sampling clock used to sample the electrical signals. For example, FIG. 9 shows a bathtub curve representing error rates (i.e., vertical axis showing bit error rates (BER) in logarithmic form) over a range of phase offsets of the sampling clock (i.e., horizontal axis). By offsetting the phase of the sampling clock from its phase-locked position over the range of phase values and determining an error rate at each offset, a width w of a data eye diagram corresponding to the received electromagnetic RF signal (or the transmitted electromagnetic RF signal in the case of determining the second error rate) may be determined. The intervals j1 and j2 surrounding the width w correspond to at least portions of a data period p that are affected by jitter. The total jitter for the data period p may be calculated by subtracting the width w from the data period p. In other words, the tester may use the determined error rates to calculate a jitter value.

Figure 10:
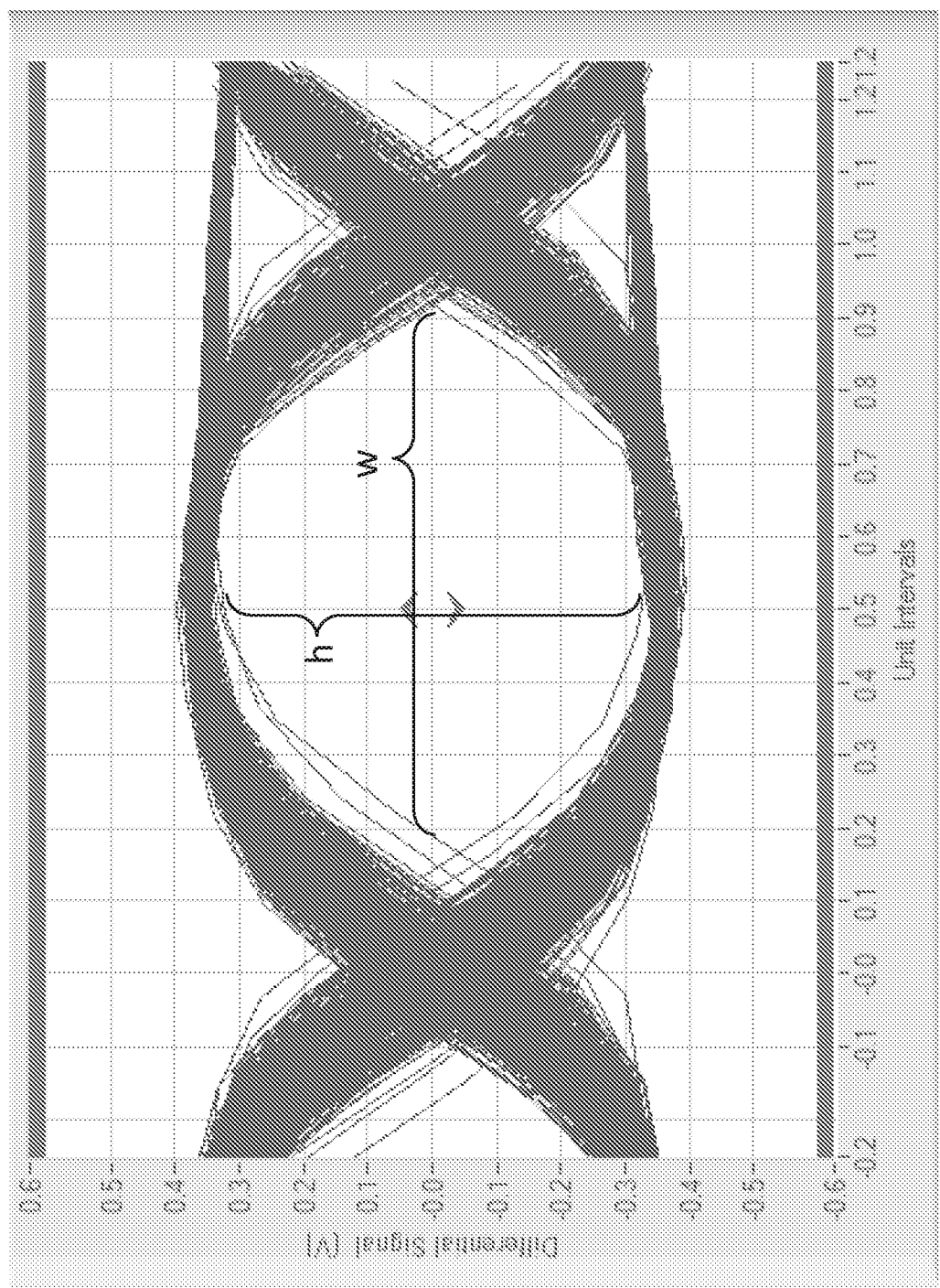
FIG. 10 shows an example data eye diagram that may correspond to the bathtub curve of FIG. 9.

FIG. 10 shows an example data eye diagram that may correspond to the bathtub curve of FIG. 9. As discussed above, the bathtub curve of FIG. 9 may be achieved by determining error rates while varying the phase of the sampling clock. Here, the data eye diagram of FIG. 10 may be achieved by determining error rates while varying both the phase of the sampling clock (i.e., horizontal scan) and the reference voltage level with which sampled voltages are compared with to determine whether the sampled voltage is deemed a "1" or "0" (i.e., vertical scan). The data eye diagram may be characterized by a width w and a height h of the "open eye."

In other words, the data eye diagram of FIG. 10 may be achieved by changing the vertical and horizontal sampling scan offset. For each vertical scan offset, the tester may scan horizontally from −32 to 32. FIG. 9 shows the bathtub curve for a vertical scan offset 0th (i.e., zero vertical offset) sample for horizontal offsets −32 to 32. By scanning horizontal offsets from −32 to 32 for a range of vertically offsets, a 2D eye diagram may be plotted. Since obtaining data points for a 2D eye diagram may be time consuming, it may be omitted, for example, during testing for mass production.

According to some embodiments, one or more of the test circuits may remove jitter from the first electrical signal before routing the first electrical signal to the transmitter of the DUT, for example, by re-timing the first electrical signal. This would allow the tester to isolate and measure only the one-way jitter in the received electromagnetic RF signal. One or more of the test circuits may introduce a known amount of jitter into the transmitted electromagnetic RF signal or the received electromagnetic RF signal during testing. One or more of the test circuits may utilize the error rate to calculate a height, a width, or both the height and width of a data eye diagram associated with the transmitted electromagnetic RF signal.

Figure 7A:
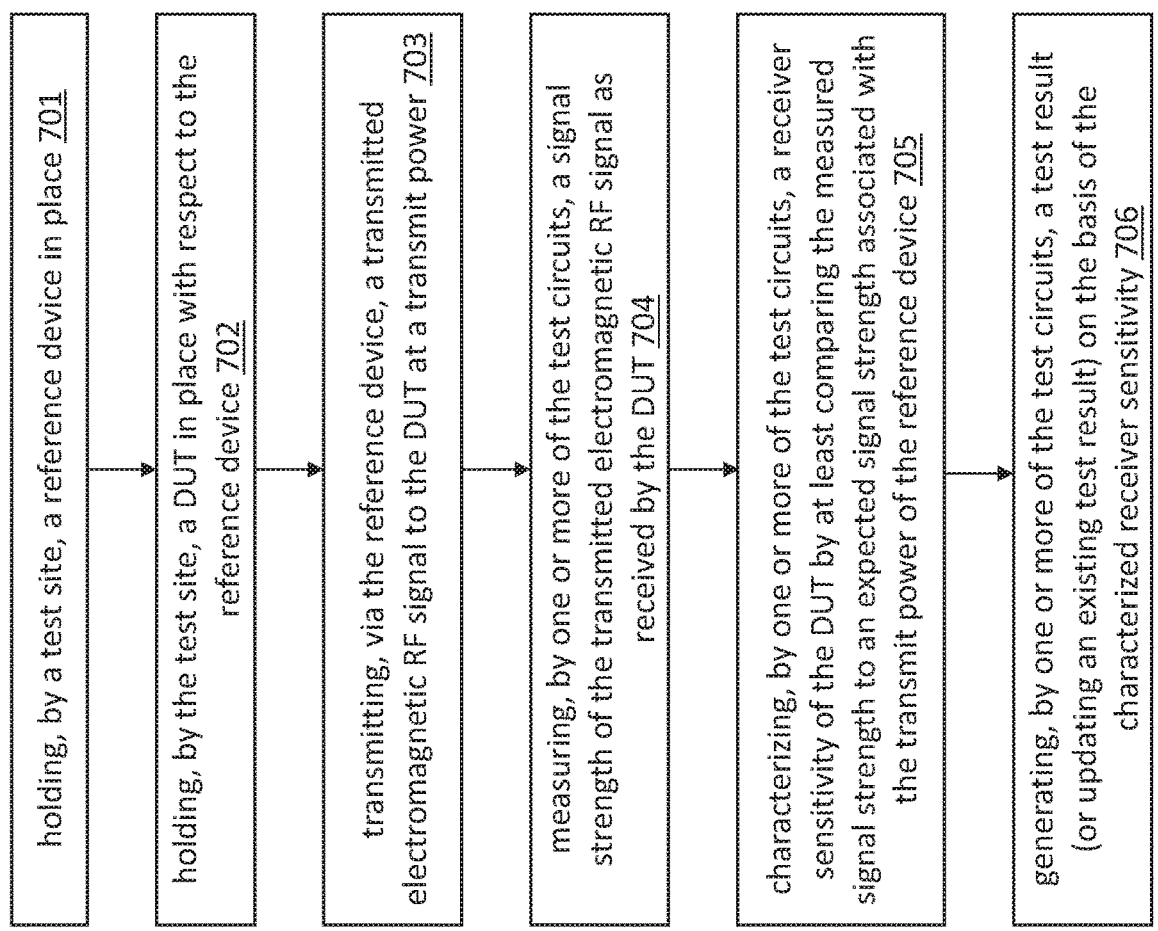
FIGS. 7A and 7B each illustrates an example method of testing the receiver sensitivity of one or more DUTs by using one or more reference devices, according to an embodiment.

FIG. 7A illustrates an example method of testing the receiver sensitivity of one or more DUTs by using one or more reference devices, according to an embodiment. The method of FIG. 7A may be practiced, for example, by the tester shown in FIGS. 3 and 4A, which includes one or more test sites. According to the example method, a test site holds a reference device in place (at 701) and holds a DUT in place with respect to the reference device (at 702). The test site transmits, via the reference device, a transmitted electromagnetic RF signal to the DUT at a transmit power (at 703). Though the transmit power of each reference device held by each test site may vary from one another, the transmit power of each reference device may be known through prior testing and characterization of the reference device.

One or more test circuits operatively coupled to the test site measures a signal strength of the transmitted electromagnetic RF signal as received via the DUT (at 704). One or more of the test circuits characterizes a receiver sensitivity of the DUT by at least comparing the measured signal strength to an expected signal strength associated with the transmit power of the reference device (at 705). The expected signal strength associated with the transmit power of the reference device may be obtained through prior testing and characterization. For example, during prior testing, separate RF equipment may be placed where the DUT would be held by the test site to measure the expected signal strength corresponding to a transmission by the reference device at the known transmit power. In some embodiments, expected signal strength may be obtained for a range of transmit powers, such as in the form of a reference table, and saved in the tester's memory for use across a plurality of test sites.

For example, consider the case in which the transmit power of the reference device is known to be 175 mV and the corresponding expected signal strength is −5 dBm. If the measured signal strength is measured to be −8 dBm, the receiver sensitivity of the DUT may be characterized by the tester as being lower than expected. However, this does not necessarily mean the DUT fails testing; the receiver sensitivity, though lower than expected, may still be within an acceptable range, depending on the testing parameters and tolerances that have been set.

One or more of the test circuits generates a test result on the basis of the characterized receiver sensitivity (at 706). In one embodiment, the test result may include or may only be a pass status or a fail status, the pass status indicating the characterized received sensitivity of the DUT is within a predetermined range, and the fail status indicating the characterized received sensitivity of the DUT is outside the predetermined range. In another embodiment, the test result may include a tiered status (e.g., bin 1R=excellent receiver sensitivity and bin 2R=good receiver sensitivity). The test result may be stored by the tester, transmitted to an external computer, or both.

Figure 7B:
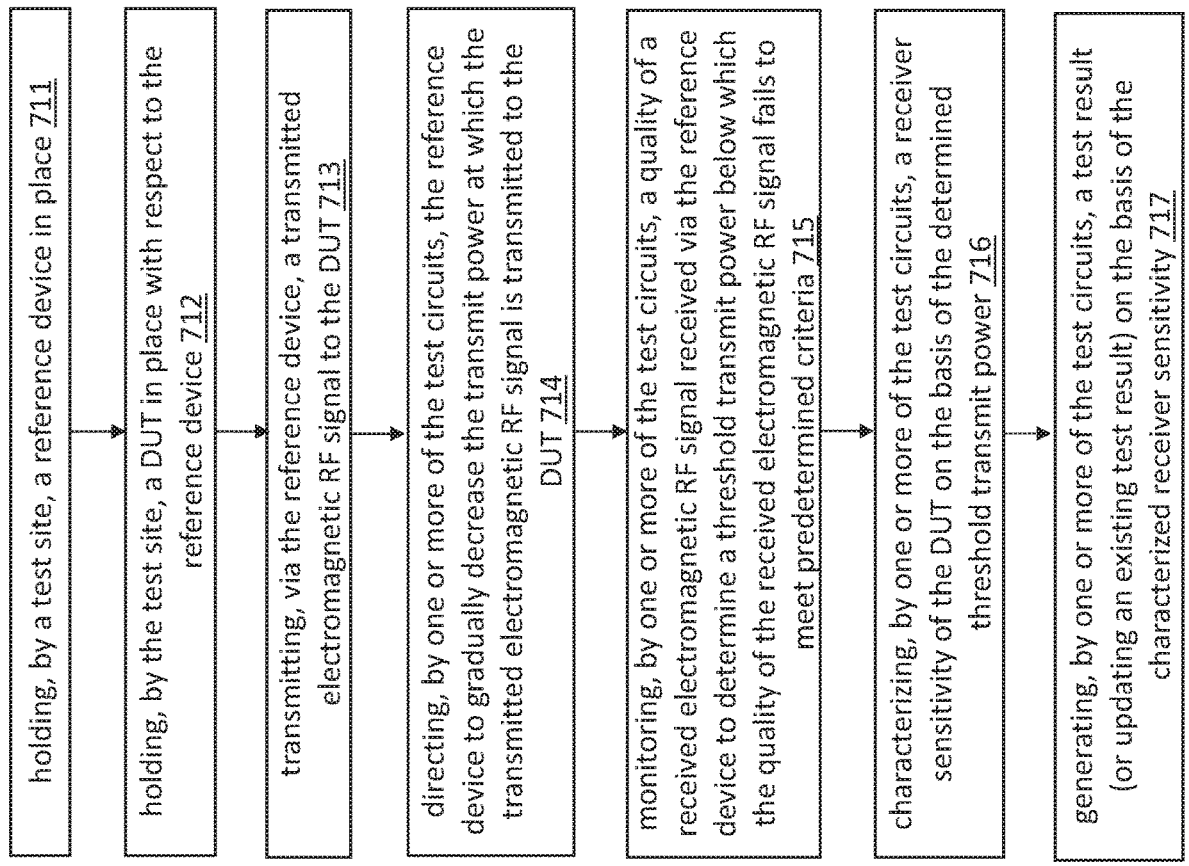

FIG. 7B illustrates an example method of testing the receiver sensitivity of one or more DUTs by using one or more reference devices, according to another embodiment. The method of FIG. 7B may be practiced, for example, by the tester shown in FIGS. 4B and 4C, which includes one or more test sites. According to the example method, a test site holds a reference device in place (at 711) and holds a DUT in place with respect to the reference device (at 712). The test site transmits, via the reference device, a transmitted electromagnetic RF signal to the DUT (at 713).

During transmission of the transmitted electromagnetic RF signal, one or more of the test circuits operatively coupled to the test site may direct the reference device to gradually decrease the transmit power at which the transmitted electromagnetic RF signal is transmitted to the DUT (at 714). For example, the reference device may be configured to transmit at one of a plurality of transmit power levels, and one or more of the test circuits may dynamically change the settings of the reference device during test to gradually step down the transmit power level of the reference device.

One or more of the test circuits monitors a quality of a received electromagnetic RF signal received via the reference device to determine a threshold transmit power below which the quality of the received electromagnetic RF signal fails to meet predetermined criteria (at 715). For example, one or more of the test circuits may monitor an error rate in the data encoded in the received electromagnetic RF signal, and the threshold transmit power may be determined when the error rate exceeds a predetermined tolerance level. In some cases, one or more of the test circuits may determine that a threshold transmit power has been reached when the received electromagnetic RF signal is cut off and no longer being received by the reference device.

One or more of the test circuits characterizes a receiver sensitivity of the DUT on the basis of the determined threshold transmit power (at 716). For example, similar to the characterization described above in connection with FIG. 5A, an expected signal strength associated with each of a range of transmit powers may be obtained through prior testing and characterization and stored by the tester. Using the stored values, which may be in table form, the tester may determine the expected signal strength for the threshold transmit power.

For example, consider the case in which a minimum acceptable receiver sensitivity level is set at −8 dBm (e.g., by sampling a plurality of DUTs verified to operate according to design specifications). If the threshold transmit power of the reference device is determined to be 175 mV and the corresponding expected signal strength is −5 dBm, the receiver sensitivity of the DUT may be characterized by the tester as being lower than expected. On the other hand, if the threshold transmit power of the reference device is determined to be 165 mV and the corresponding expected signal strength is −10 dBm, the receiver sensitivity of the DUT may be characterized by the tester as being higher than expected.

One or more of the test circuits generates a test result on the basis of the characterized receiver sensitivity (at 717). In one embodiment, the test result may include or may only be a pass status or a fail status, the pass status indicating the characterized received sensitivity of the DUT is within a predetermined range, and the fail status indicating the characterized received sensitivity of the DUT is outside the predetermined range. In another embodiment, the test result may include a tiered status (e.g., bin 1R=excellent receiver sensitivity and bin 2R=good receiver sensitivity). The test result may be stored by the tester, transmitted to an external computer, or both.

Figure 7C:
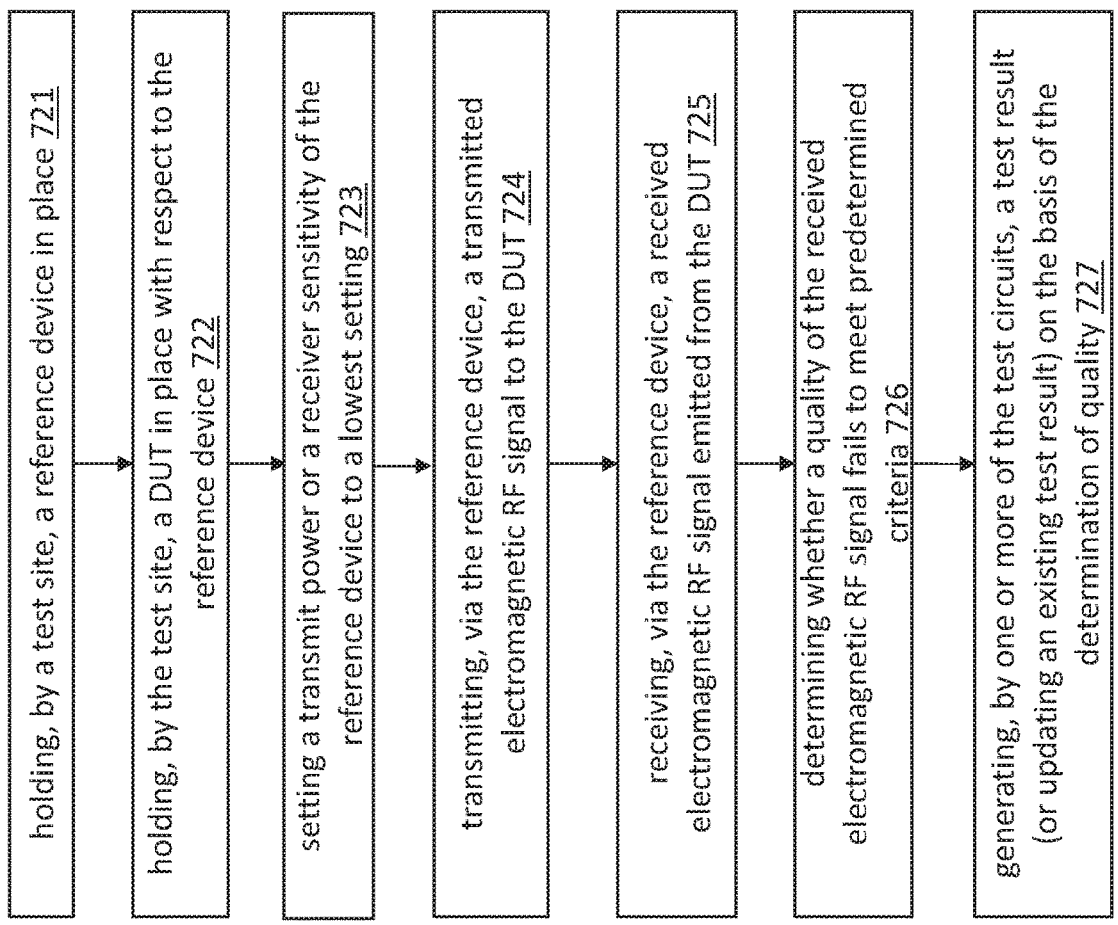
FIG. 7C illustrates an example method of screening out weak transmitting and weak receiving DUTs, according to an embodiment.

FIG. 7C illustrates an example method of screening out weak transmitting and weak receiving DUTs, according to an embodiment. The method of FIG. 7C may be practiced, for example, by the tester shown in FIGS. 4B, 4C and 4D, which includes one or more test sites. According to the example method, a test site holds a reference device in place (at 721) and holds a DUT in place with respect to the reference device (at 722). One or more of the test circuits sets a transmit power or a receiver sensitivity of the reference device to a lowest setting (at 723). The lowest setting may be the lowest possible setting of the reference device, or in some cases, the lowest setting may correspond to a threshold setting at which weak transmitting/receiving DUTs would be deemed to fail if they cannot establish an acceptable communications link with the reference device configured at the threshold setting. The test site transmits, via the reference device, a transmitted electromagnetic RF signal to the DUT (at 724). The test site receives, via the reference device, a received electromagnetic RF signal emitted from the DUT (at 725).

One or more of the test circuits determines whether a quality of the received electromagnetic RF signal fails to meet predetermined criteria (e.g., whether the error rate exceeds a predetermined tolerance level) (at 726). One or more of the test circuits generates a test result (or updating an existing test result) on the basis of the determination of quality. For example, the tester may either pass or fail the DUT to screen out weak transmitting/receiving DUTs.

Figure 8:
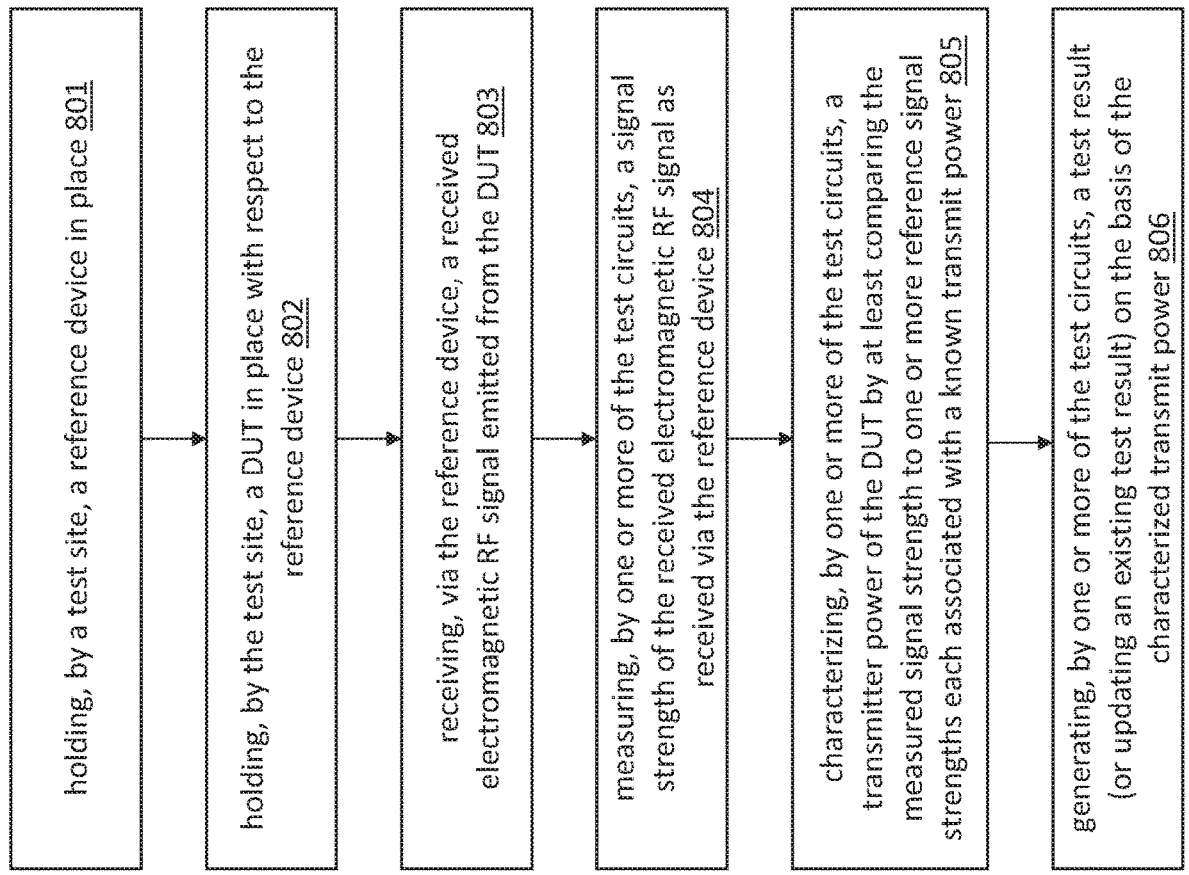
FIG. 8 illustrates an example method of testing the transmit power of one or more DUTs by using one or more reference devices, according to an embodiment.

FIG. 8 illustrates an example method of testing the transmit power of one or more DUTs by using one or more reference devices, according to an embodiment. The method of FIG. 8 may be practiced, for example, by the tester shown in FIG. 3, which includes one or more test sites. The example methods of FIG. 7 and FIG. 8 may be combined to test both the receiver sensitivity and transmit power of the DUTs in one test flow. According to the example method of FIG. 8, a test site holds a reference device in place (at 801) and holds a DUT in place with respect to the reference device (at 802). The test site receives, via the reference device, a received electromagnetic RF signal emitted from the DUT (at 803).

One or more test circuits operatively coupled to the test site measures a signal strength of the received electromagnetic RF signal as received via the reference device (at 804). One or more of the test circuits characterizes a transmitter power of the DUT by at least comparing the measured signal strength to one or more reference signal strengths each associated with a known transmit power (at 805). The one or more reference signal strengths may be obtained through prior testing and characterization of the reference device. For example, during prior testing, separate RF equipment may be placed where the DUT would be held by the test site to transmit electromagnetic RF signals to the reference device using a range of transmit powers, and the signal strength of the electromagnetic RF signals as received via the reference device may be measured at each transmit power. A table of reference signal strengths, such as example Table 1 below, may be obtained for each reference device through prior testing and characterization:

TABLE 1

| Transmitter power | Reference signal strength |
|---|---|
| 175 mV | −5 dBm |
| 165 mV | −10 dBm |
| 155 mV | −20 dBm |
| 145 mV | −30 dBm |

The reference signal strengths represent the receiver sensitivity of the reference device. Because each reference device may vary slightly from one another, for example, due to manufacturing variations, the reference signal strengths may be particular to or uniquely associated with each reference device and may be independently obtained for each reference device.

By referencing or comparing the measured signal strength of the received electromagnetic RF signal (transmitted via the DUT and received via the reference device) against the reference signal strengths, for example, of Table 1, the tester may estimate the transmit power of the DUT. Consider the case in which the measured signal strength is −8 dBm. Then, according to Table 1, the transmit power of the DUT would be between 175 mV and 165 mV. Depending on the testing parameters and tolerances that have been set, the transmit power of the DUT may be considered too high, too low, or acceptable.

One or more of the test circuits generates a test result (or updates an existing test result) on the basis of the characterized transmit power (at 806). In one embodiment, the test result may include or only be a pass or a fail status, the pass status indicating the characterized transmit power of the DUT is within a predetermined range, and the fail status indicating the characterized transmit power of the DUT is outside the predetermined range. In another embodiment, the test result may include a tiered status (e.g., bin 1T=excellent transmit power and bin 2T=good transmit power). The test result may be stored by the tester, transmitted to an external computer, or both.

Although the methods of FIGS. 6, 7A, 7B, 7C and 8 are presented separately, the teachings of the present disclosure are not limited thereto. According to some embodiments, combinations or subcombinations of methods of FIGS. 6, 7A, 7B, 7C and 8 may be performed sequentially or in parallel with each other. Furthermore, although the methods are described herein as being performed by various components of the tester, such as its one or more test circuits, the present disclosure is not limited thereto and contemplates embodiments in which some portions of the method are performed by an external computer (e.g., element 360 of FIG. 3) connected to the tester. For example, the external computer may log the DUT test data and results onto a database for future analysis, such as a yield analysis to improve production yields.

Mechanical Alignment

Figure 11A:
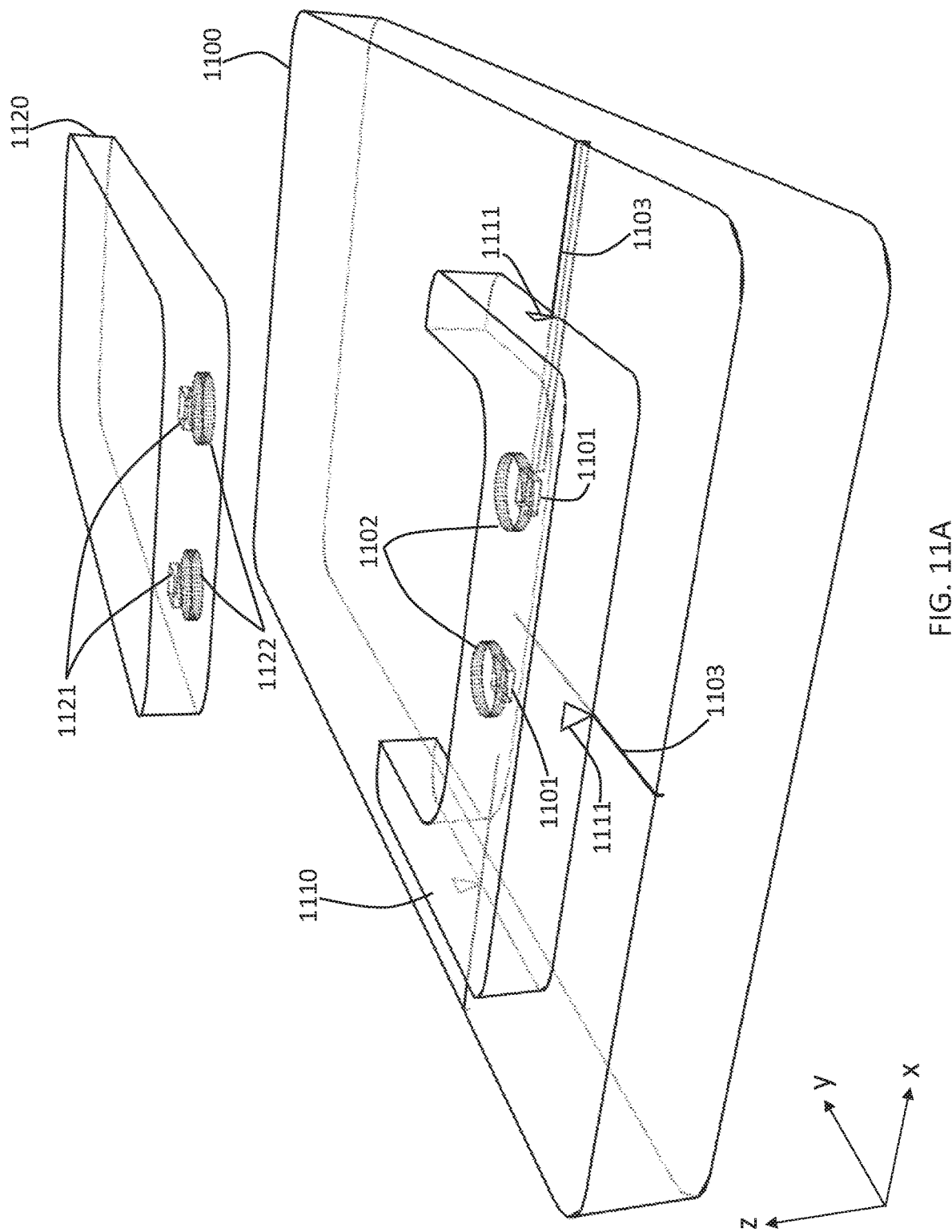
FIGS. 11A, 11B, and 11C illustrate an example of a reference device having a structure configured to mate with a DUT and an adjustment mechanism that would enable a tester operator to adjust an alignment between the reference device and the DUT when the two are mated, according to an embodiment Like reference symbols in the various drawings indicate like elements.
Figure 11B:
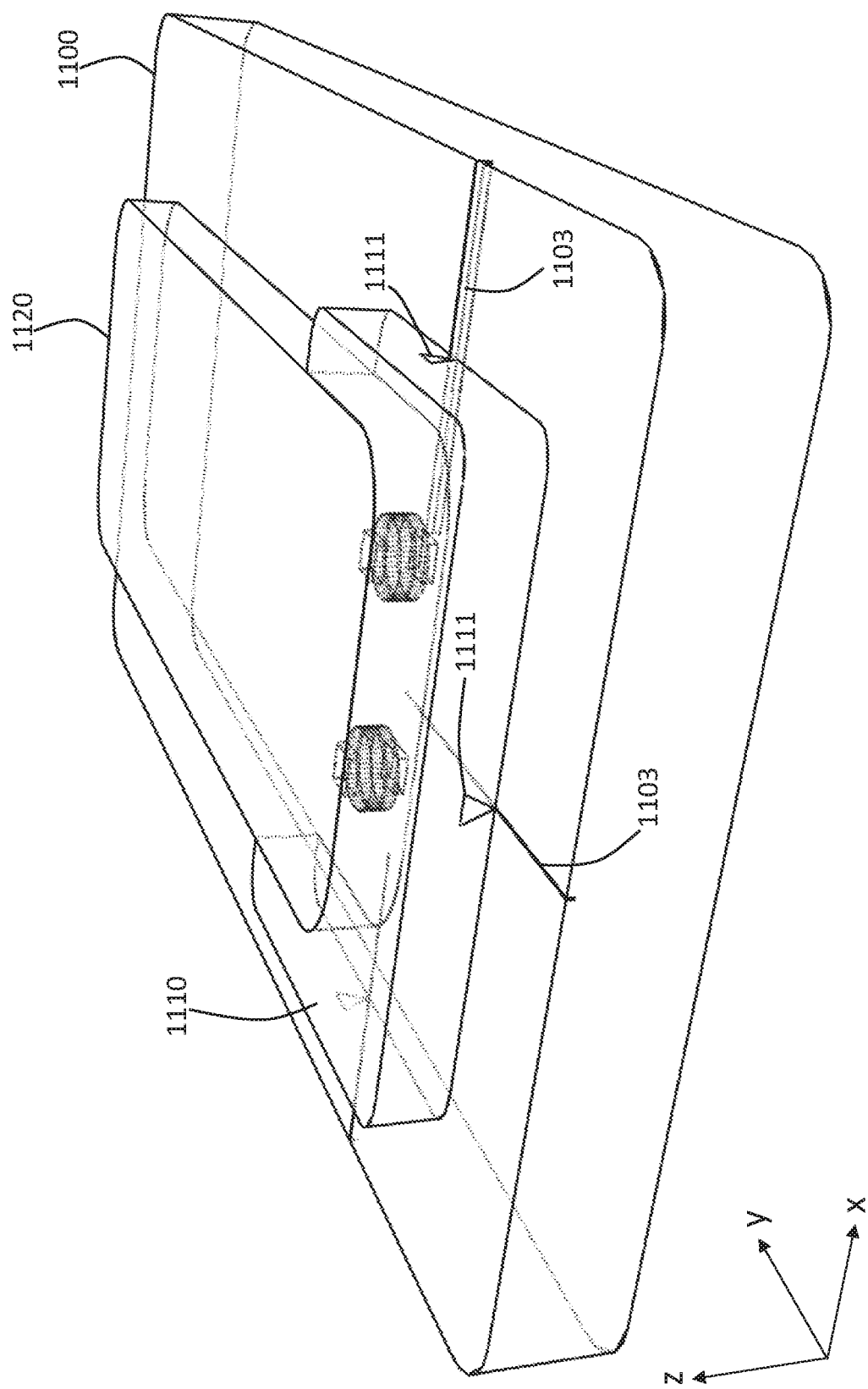
Figure 11C:
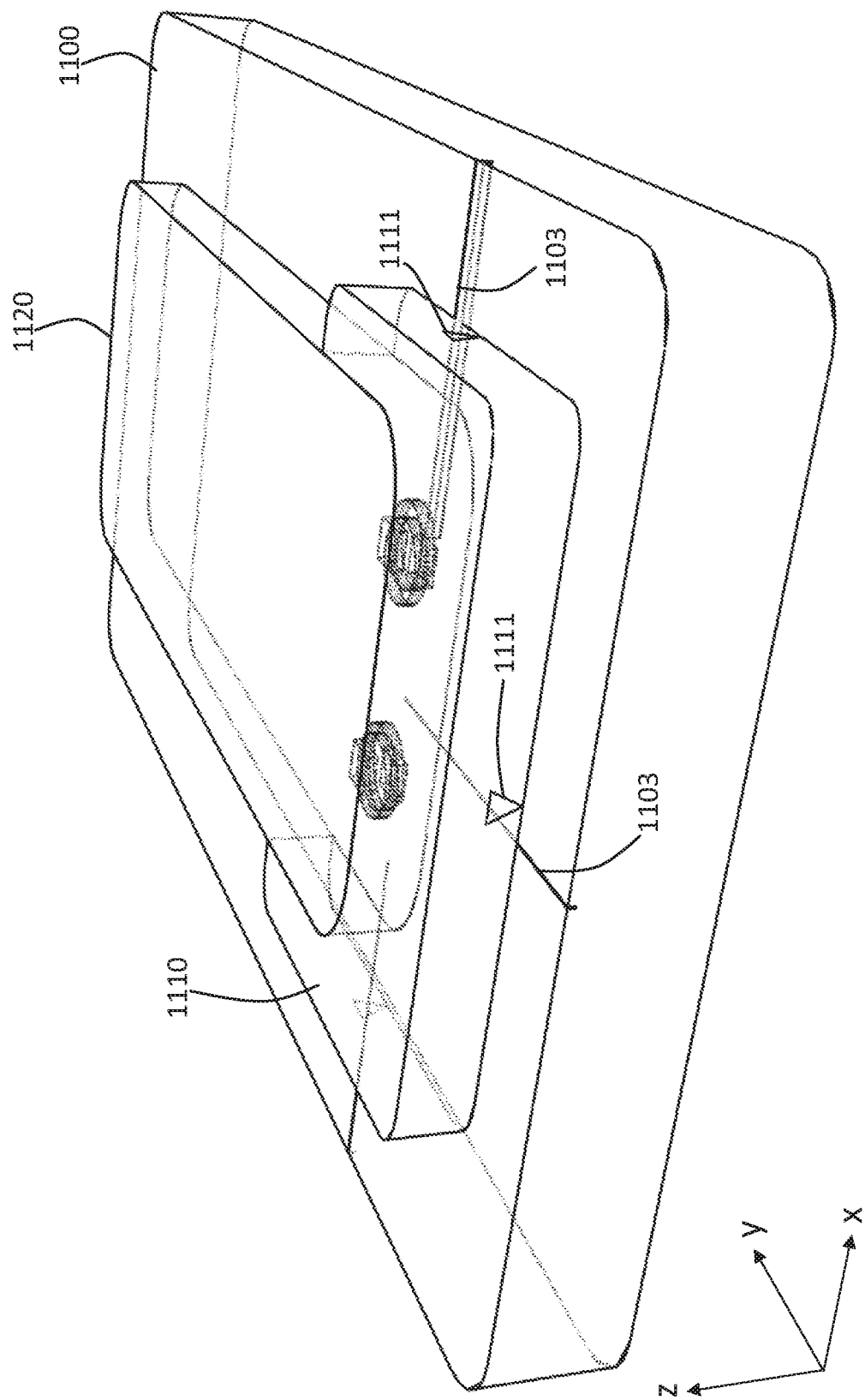

FIGS. 11A-11C illustrate an example of a reference device having a structure configured to mate with a DUT and an adjustment mechanism that would enable a tester operator to adjust an alignment between the reference device and the DUT when the two are mated, according to an embodiment. In particular, FIG. 11A shows a view in which the reference device and the DUT are in an unmated state, FIG. 11B shows a view in which the reference device and the DUT are in a mated state and in optimal alignment with each other, and FIG. 11C shows a view in which the reference device and the DUT are in a mated state and in suboptimal alignment with each other.

The DUT 1120, which resembles a smartphone in this case, includes communication modules that each have a communication unit 1121 and a signal guiding structure 1122 forming a channel. The communication unit 1121 may include a transmitter, a receiver, or a transceiver of electromagnetic signals. The communication modules, for example, may correspond to those described above in connection with FIGS. 1 and 2.

The reference device, which resembles a dock in this case, includes a body portion 1100 and a mating portion 1110. The body portion 1100 includes corresponding communication modules for communicating with those of the DUT in the mated state. The mating portion 1110 has a structure that is configured to mate with a corresponding structure of the DUT 1120. The mating portion structure may have features that are complementary to those of the DUT structure. In this case, the mating portion 1110 has a concave shape that is complementary to and receives at least a portion of the DUT 1120 in the mated state, as shown in FIGS. 11B and 11C.

The reference device may include an adjustment mechanism that enables the x- and y position of the mating portion 1110 to be adjusted relative to the body portion 1100. Although the adjustment mechanism is not expressly shown in FIGS. 11A-11C to avoid overcomplicating the views, any mechanism known to those of ordinary skill in the art may be used (e.g., actuators, threaded guide rails, and lock-and-release mechanisms). Adjusting the x and y position of the mating portion 1110 relative to the body portion 1100 also adjusts an alignment between the signal guiding structures 1122 of the DUT 1120 and the signal guiding structures 1102 of the body portion 1100 in the mated state, thereby allowing a test operator to test the DUT 1120 under optimal (e.g., guiding structures are perfectly aligned) or suboptimal alignment conditions (e.g., guiding structures are misaligned).

As FIG. 11B shows, optimal alignment between the guiding structures 1122 and 1102 may be achieved when the x and y position of the mating portion 1110 relative to the body portion 1100 is adjusted such that markers 1111 of the mating portion 1110 coincide with markers 1103 of the body portion 1100. Conversely, FIG. 11C shows that suboptimal alignment between the guiding structures 1122 and 1102 may be achieved when the x and y position of the mating portion 1110 relative to the body portion 1100 is adjusted such that markers 1111 of the mating portion 1110 do not coincide with markers 1103 of the body portion 1100.

According to further embodiments, the reference device may further include a z position adjustment mechanism that enables a test operator to adjust the distance between the guiding structures 1122 and 1102 along the z-axis. This would allow the test operator, for example, to test the DUT 1120 under optimal or suboptimal range conditions.

Various embodiments of the present system and method may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

A number of embodiments of the invention have been described. Nevertheless, it will be understood that various modifications may be made without departing from the spirit and scope of the invention. Accordingly, other embodiments are within the scope of the following claims.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. For example, elements 501 and 502 may occur in parallel or in reverse order, and elements 701 and 704 may occur in reverse order. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A tester comprising:
   a test site configured to:
      hold a reference device,
      hold a device under test (DUT) with respect to the reference device,
      transmit, via the reference device, a first electromagnetic radio frequency (RF) signal to the DUT, the first electromagnetic RF signal including a test data pattern, and
      receive, via the reference device, a second electromagnetic RF signal emitted from the DUT; and
   one or more test circuits operatively coupled to the test site and configured to:
      determine a first error rate between the test data pattern and data extracted from the second electromagnetic RF signal, and
      generate a test result based on the first error rate.

2. The tester of claim 1, wherein the test site comprises a first test socket configured to hold the reference device and a second test socket configured to hold the DUT.

3. The tester of claim 1, wherein the test site holds the reference device and the DUT a predetermined distance from each other based on a communication range of the DUT using extremely high frequency (EHF) signals.

4. The tester of claim 1, further comprising one or more waveguide configured to focus and facilitate propagation of electromagnetic RF signals between the reference device and the DUT.

5. The tester of claim 1, wherein the test site comprises one or more adjustment mechanism configured to adjust an alignment between the reference device and the DUT.

6. The tester of claim 5, wherein the one or more adjustment mechanisms provide for adjusting the alignment along two axes.

7. The tester of claim 1, further comprising a mating structure having features complementary to a structure of the DUT and configured to hold the DUT in position.

8. The tester of claim 1, further comprising one or more additional test sites.

9. A method comprising:
   holding a reference device that has previously passed testing in a way that the reference device is known to operate according to specified operational parameters, including positioning the reference device in a first test socket of a test site;

holding a device under test (DUT) with respect to the reference device, including positioning the DUT in a second test socket of the test site, in a way that the reference device and the DUT are held a predetermined distance and degree of alignment from each other based on a communication range of the DUT using extremely high frequency (EHF) signals;

transmitting, from the reference device, a transmitted electromagnetic radio frequency (RF) signal to the DUT, the transmitted electromagnetic RF signal including a test data pattern;

receiving, at the reference device, a received electromagnetic RF signal emitted from the DUT;

receiving, from a receiver of the reference device, an electrical signal converted from the received electromagnetic RF signal;

extracting, by one or more test circuits, data from the electrical signal;

determining, by one or more test circuits, an error rate between the test data pattern and the extracted data; and generating, by one or more test circuits, a test result based on the error rate.

10. The method of claim 9, wherein the reference device and DUT each include communication modules that are manufactured according to a same design to meet a predetermined set of operational specifications.

11. The method of claim 9, wherein communication modules of the reference device are substantially identical to communication modules of the DUT in structure excluding variations due to manufacturing tolerance and defects.

12. The method of claim 9, further comprising testing the receiver sensitivity of the DUT, comprising:
transmitting the electromagnetic RF signal to the DUT at a specified transmit power;
measuring a signal strength of the RF signal received by the DUT; and
comparing the measured signal strength to an expected signal strength associated with the specified transmit power of the reference device.

13. The method of claim 9, further comprising testing the receiver sensitivity of the DUT, comprising:
transmitting the electromagnetic RF signal to the DUT at a specified transmit power;
gradually decreasing the transmit power at which the transmitted electromagnetic RF signal is transmitted to the DUT; and
monitoring a quality of the RF signal received at the DUT to determine a threshold transmit power below which the quality of the received RF signal fails to meet predetermined criteria.

14. The method of claim 9, wherein positioning the reference device and the DUT in a way that that they are held at a predetermined degree of alignment includes adjusting the alignment to create a particular misalignment between the reference device and the DUT.

15. A tester comprising:
means for holding a reference device and a device under test (DUT) with respect to each other;
means for transmitting, via the reference device, a first electromagnetic radio frequency (RF) signal to the DUT, the first electromagnetic RF signal including a test data pattern, and
means for receiving, from the reference device, a second electromagnetic RF signal emitted from the DUT;
means for determining a first error rate between the test data pattern and data extracted from the second electromagnetic RF signal; and
means for generating a test result based on the first error rate.

16. The tester of claim 15, wherein the means for holding comprises a first test socket configured to hold the reference device and a second test socket configured to hold the DUT.

17. The tester of claim 15, wherein the means for holding holds the reference device and the DUT a predetermined distance from each other based on a communication range of the DUT using extremely high frequency (EHF) signals.

18. The tester of claim 15, further comprising means for focusing and facilitating propagation of electromagnetic RF signals between the reference device and the DUT.

19. The tester of claim 15, further comprising means for adjusting an alignment between the reference device and the DUT.

20. The tester of claim 19, wherein the means for adjusting provide for adjusting the alignment along two axes.

21. The tester of claim 15, further comprising a mating means having features complementary to a structure of the DUT and configured to hold the DUT in position.

* * * * *